(12) United States Patent
Johnson

(10) Patent No.: US 9,097,983 B2
(45) Date of Patent: Aug. 4, 2015

(54) SCANNED-SPOT-ARRAY EUV LITHOGRAPHY SYSTEM

(71) Applicant: Kenneth C. Johnson, Santa Clara, CA (US)

(72) Inventor: Kenneth C. Johnson, Santa Clara, CA (US)

( * ) Notice: Subject to any disclaimer, the term of this patent is extended or adjusted under 35 U.S.C. 154(b) by 181 days.

(21) Appl. No.: 13/801,919

(22) Filed: Mar. 13, 2013

(65) Prior Publication Data
US 2013/0258305 A1 Oct. 3, 2013

Related U.S. Application Data

(60) Provisional application No. 61/618,584, filed on Mar. 30, 2012, provisional application No. 61/675,709, filed on Jul. 25, 2012.

(51) Int. Cl.
G03B 27/54 (2006.01)
G03B 27/42 (2006.01)
G03F 7/20 (2006.01)

(52) U.S. Cl.
CPC ............ *G03F 7/702* (2013.01); *G03F 7/70208* (2013.01)

(58) Field of Classification Search
CPC ............................... G03F 7/702; G03F 7/0208
USPC ............. 355/52, 53, 55, 67, 71; 359/291–292
See application file for complete search history.

(56) References Cited

U.S. PATENT DOCUMENTS

| | | | |
|---|---|---|---|
| 5,161,057 A | 11/1992 | Johnson | |
| 5,212,588 A * | 5/1993 | Viswanathan et al. | ........ 359/355 |
| 5,589,982 A | 12/1996 | Faklis et al. | |
| 5,900,637 A | 5/1999 | Smith | |
| 6,133,986 A | 10/2000 | Johnson | |
| 6,177,980 B1 | 1/2001 | Johnson | |
| 6,214,633 B1 | 4/2001 | Clark et al. | |
| 6,238,852 B1 | 5/2001 | Klosner | |
| 6,331,710 B1 | 12/2001 | Wang et al. | |
| 6,424,404 B1 | 7/2002 | Johnson | |

(Continued)

OTHER PUBLICATIONS

Bass, M., *Handbook of Optics*, 2nd ed. (Optical Society of America, Washington, DC, 1995,) vol. 2, pp. 1.23-26 and 18.15, 7 pages.

(Continued)

*Primary Examiner* — Hung Henry Nguyen
(74) *Attorney, Agent, or Firm* — Kilpatrick Townsend & Stockton LLP

(57) ABSTRACT

In an EUV scanned-spot-array lithography system, a modulated array of radiation beams diverging from object spots on an object surface and is projected onto a printing surface via a two-mirror projection system similar to a flat-image, Schwarzschild system. Each beam converges to a diffraction-limited image point on the surface, and the surface is scanned in synchronization with the beam modulation to print a synthesized, high-resolution raster image. The spot-generation optics can be configured to compensate for object field curvature, distortion, and geometric point-imaging aberrations in the projection system, enabling diffraction-limited printing without coherent proximity effects over the full image field. The spot-generation optics can use either micromirrors or transmitting microlenses, and can be diffractive (e.g., phase-Fresnel lenses) or non-diffractive. Chromatic dispersion in either refractive or diffractive elements can be substantially eliminated by configuring the micro-optics as Schupmann achromatic doublets.

20 Claims, 28 Drawing Sheets

(56) References Cited

U.S. PATENT DOCUMENTS

| | | | |
|---|---|---|---|
| 6,498,685 | B1 | 12/2002 | Johnson |
| 6,639,201 | B2 | 10/2003 | Almogy et al. |
| 6,897,941 | B2 | 5/2005 | Almogy |
| 6,960,773 | B2 | 11/2005 | Menon et al. |
| 6,967,711 | B2 | 11/2005 | Gui |
| 7,079,306 | B2 | 7/2006 | McGeoch |
| 7,116,402 | B2 | 10/2006 | Gui |
| 7,116,405 | B2 | 10/2006 | Johnson |
| 7,239,373 | B2 * | 7/2007 | Tinnemans et al. .............. 355/67 |
| 7,251,020 | B2 | 7/2007 | Gui |
| 7,846,649 | B2 * | 12/2010 | Tirosh et al. .................. 430/396 |
| 7,859,647 | B2 * | 12/2010 | Bleeker et al. .................. 355/67 |
| 8,390,787 | B2 | 3/2013 | Gui et al. |
| 8,687,277 | B2 | 4/2014 | Johnson |
| 2008/0298552 | A1 | 12/2008 | Derra et al. |
| 2009/0046299 | A1 | 2/2009 | Menon et al. |
| 2010/0079739 | A1 | 4/2010 | Goehnermeier et al. |
| 2010/0097703 | A1 | 4/2010 | Menon et al. |
| 2014/0285878 | A1 | 9/2014 | Escuti |

OTHER PUBLICATIONS

Bomzon et al., "Radially and azimuthally polarized beams generated by space-variant dielectric subwavelength gratings," Optics Letters vol. 27(5), 2002, pp. 285-287.

Brandt, et al., "LPP EUV Source Development for HVM," in Proceedings of SPIE vol. 6517, Emerging Lithographic Technologies XI, M. J. Lercel, Ed., 65170Q, 2007, 10 pages.

Burnett et al., "Birefringence issues with uniaxial crystals as last lens elements for high-index immersion lithography," Proceedings SPIE 7274, 2009, pp. 727421-1-727421-11.

Constancias et al., "Fabrication of large area ultrathin silicon membrane: Application for high efficiency extreme ultraviolet diffraction gratings," Journal of Vacuum Science & Technology, 2010, B 28, pp. 194-197.

Fritze et al., "Gratings of regular arrays and trim exposures for ultralarge scale integrated circuit phase-shift lithography," Journal of Vacuum Science & Technology, 2001, B 19(6), 2366-2370.

Goldstein et al., "EUV micro-exposure tool at 0.5 Aa for sub-16 nm lithography," Optics Letters, 2008, 33(4), pp. 2995-2997.

Goodman, J. W., *An Introduction to Fourier Optics*, 1996, Sect. 3.4.2, pp. 44-45, 4 pages, McGraw-Hill.

Jung et al., "Selective dry etching of attenuated phase-shift mask materials for extreme ultraviolet lithography using inductively coupled plasmas," Journal of Vacuum Science & Technology, 2009, B 27, pp. 2361-2365.

Kingslake, R., *Lens Design Fundamentals, Academic Press*, London, 1978, pp. 89-92, 6 pages.

Menon et al., "Absorbance-modulation optical lithography," Journal of the Optical Society of America A, 2006, vol. 23, Issue 9, pp. 2290-2294.

Menon et al., "Design of diffractive lenses that generate optical nulls without phase singularities," Journal of the Optical Society of America A, 2009, vol. 26, Issue 2, pp. 297-304.

Miyamoto, K., "The Phase Fresnel Lens," Journal of the Optical Society of America, vol. 51(1), 1961, pp. 17-20.

Nam et al., "Potential of Solid Immersion Lithography using I-line and KrF light source," Proceedings SPIE 5745, 2005, pp. 1049-1055.

Pelletier et al., "Aluminum nanowire polarizing grids: Fabrication and analysis," Applied Physics Letters, vol. 88, 2006, pp. 211114-1-211114-3.

Richter et al., "Design considerations of form birefringent microstructures," Applied Optics, 1995, vol. 34(14), pp. 2421-2429.

Salmassi et al., "Multilayer phase-only diffraction gratings: Fabrication and application to extreme ultraviolet optics," Journal of Vacuum Science & Technology, B 25, 2007, 17 pages.

Smith et al., "25nm Immersion Lithography at a 193nm Wavelength," Proceedings SPIE 5745, 2004, pp. 141-147.

Tsai et al., "Fabrication of spiral-phase diffractive elements using scanning-electron beam-lithography," Journal of Vacuum Science & Technology, 2007, B 25, pp. 2068-2071.

Tsai et al., "Far-Field Optical Imaging at the Nanoscale via Absorbance Modulation," *Novel Techniques in Microscopy*, OSA Technical Digest (CD,) Optical Society of America, 2009, paper NMA2, 3 pages.

Watanabe et al., "Generation of a doughnut-shaped beam with a spiral phase plate," Review of Scientific Instruments, vol. 75, 2004, 5131-5135.

Williamson, D. M., "Evolution of ring-field systems in microlithography," SPIE Proceedings, 1998, vol. 3482, 8 pages.

Yoder, "Opto-Mechanical Systems Design, Third Edition," CRC Press, 2006, pp. 368-370, 5 pages.

Zimmerman et al., "High Index 193 nm Immersion Lithography: The Beginning or the End of the Road," Proceedings of SPIE 7274, 2009, pp. 727420-1-727420-11.

U.S. Appl. No. 13/103,874, filed May 9, 2011 for Johnson.
U.S. Appl. No. 61/498,427, filed Jun. 17, 2011 for Johnson.
U.S. Appl. No. 61/521,684, filed Aug. 9, 2011 for Johnson.
U.S. Appl. No. 61/525,125, filed Aug. 18, 2011 for Johnson.
U.S. Appl. No. 61/531,981, filed Sep. 7, 2011 for Johnson.
U.S. Appl. No. 61/549,158, filed Oct. 19, 2011 for Johnson.
U.S. Appl. No. 13/523,843, filed Jun. 14, 2012 for Johnson.

Non-Final Office Action for U.S. Appl. No. 13/103,874, mailed Aug. 1, 2014, 6 pages.

International Search Report and Written Opinion for International PCT Application No. PCT/US2014/043462, mailed Oct. 24, 2014, 16 pages.

Notice of Allowance for U.S. Appl. No. 13/103,874, mailed Nov. 13, 2014, 6 pages.

Non-Final Office Action for U.S. Appl. No. 13/523,843, mailed Mar. 18, 2015, 8 pages.

* cited by examiner

| | |
|---|---|
| $n = 0.9238 - (0.01608\,\text{nm}^{-1})(\lambda - 13.5\,\text{nm}) - \frac{1}{2}(0.002711\,\text{nm}^{-2})(\lambda - 13.5\,\text{nm})^2;$<br>$k = 0.006435 + (0.002148\,\text{nm}^{-1})(\lambda - 13.5\,\text{nm}) + \frac{1}{2}(0.001486\,\text{nm}^{-2})(\lambda - 13.5\,\text{nm})^2$<br>$(12.0\,\text{nm} \leq \lambda \leq 15.0\,\text{nm})$ | Eq. 2.1 |
| $t \cong t_0 + \frac{1}{2} t_0'' r^2$ | Eq. 2.2 |
| $c_t = c_i - (n-1) t_0''$ | Eq. 2.3 |
| $\delta \cong R\left(\dfrac{c_t}{c_{tD}} - 1\right) = R\dfrac{n - n_D}{n_D - 1}$ (FIG. 2 refractive lens, $c_i = 0$) | Eq. 2.4 |
| $\max|\delta| = 0.029\,R$ (FIG. 2, $|\lambda - 13.5\,\text{nm}| \leq 0.01 \cdot 13.5\,\text{nm}$, $c_i = 0$) | Eq. 2.5 |
| $\tau \cong \exp[i 2\pi(n + ik - 1)t / \lambda]$, $E_t = \tau E_i$ | Eq. 2.6 |
| $|\tau|^2 = |E_t / E_i|^2 \cong \exp[-4\pi k t / \lambda]$ | Eq. 2.7 |
| $NA = R\,c_t = -R\,(n-1)\,t_0''$ ($c_i = 0$) | Eq. 2.8 |
| $\min |\tau|^2 \cong \exp[-2\pi k t_0'' R^2 / \lambda]$<br>$= \exp[2\pi k\,NA \cdot R / ((n-1)\lambda)] = 10^{-NA \cdot R/(0.0586\,\mu m)}$ ($c_i = 0$, $t_0 = 0$) | Eq. 2.9 |
| $p \cong p_0 + \frac{1}{2} p_0'' r^2$ | Eq. 3.1 |
| $c_t = c_i - \lambda p_0''$ | Eq. 3.2 |
| $\delta \cong R\left(\dfrac{c_t}{c_{tD}} - 1\right) = R\left(\dfrac{\lambda}{\lambda_D} - 1\right)$ (FIGS. 3A-3B diffractive lens, $c_i = 0$) | Eq. 3.3 |
| $\max|\delta| = 0.010\,R$ (FIGS. 3A-3B, $|\lambda - 13.5\,\text{nm}| \leq 0.01 \cdot 13.5\,\text{nm}$, $c_i = 0$) | Eq. 3.4 |
| $t = \begin{cases} h, & 0 < \text{mod}[-p, 1] < d \\ 0, & d < \text{mod}[-p, 1] < 1 \end{cases}$ (zone plate) | Eq. 5.1 |
| $t = h\,\text{mod}[\pm p, 1]$ (phase-Fresnel; $\pm(n-1) > 0$) | Eq. 5.2 |
| $t = h\,\text{floor}[L\,\text{mod}[\pm p, 1]] / (L - 1)$ ($L$-level blazed; $\pm(n-1) > 0$) | Eq. 5.3 |
| $\tau = \sum_m \tau_m \exp[i 2\pi m p]$, $\tau_m = \int_0^1 \tau \exp[-i 2\pi m p] dp$ | Eq. 5.4 |

FIG. 4A

| | |
|---|---|
| $E_{tm} = \tau_m \exp[i2\pi m p] E_t$, $\quad \|E_{tm}/E_t\|^2 = \|\tau_m\|^2$ | Eq. 5.5 |
| $\tau_m = \begin{cases} (\exp[i2\pi(n+ik-1)h/\lambda]-1)\dfrac{\exp[i2\pi m d]-1}{i2\pi m}, & m \neq 0 \\ (\exp[i2\pi(n+ik-1)h/\lambda]-1)d+1, & m = 0 \end{cases}$ (zone plate) | Eq. 5.6 |
| $\tau_m = \begin{cases} \left(\exp\left[i\pi\dfrac{(n+ik-1)\lambda_D}{\|n_D-1\|\lambda}\right]-1\right)\dfrac{(-1)^m-1}{i2\pi m}, & m \neq 0 \\ \left(\exp\left[i\pi\dfrac{(n+ik-1)\lambda_D}{\|n_D-1\|\lambda}\right]+1\right)/2, & m = 0 \end{cases}$ (zone plate; $d=\tfrac{1}{2}$; $h=\lambda_D/(2\|n_D-1\|)$) | Eq. 5.7 |
| $\tau_m = \dfrac{\exp[i2\pi(n+ik-1)h/\lambda]-1}{i2\pi((n+ik-1)h/\lambda \mp m)}$ (phase-Fresnel; $\pm(n-1) > 0$) | Eq. 5.8 |
| $\tau_m = \dfrac{\exp\left[i2\pi\dfrac{(n+ik-1)\lambda_D}{\|n_D-1\|\lambda}\right]-1}{i2\pi\left(\dfrac{(n+ik-1)\lambda_D}{\|n_D-1\|\lambda} \mp m\right)}$ (phase-Fresnel; $\pm(n-1) > 0$; $h=\lambda_D/\|n_D-1\|$) | Eq. 5.9 |
| $\tau_m = \begin{cases} \dfrac{\exp[i2\pi(n+ik-1)(hL/(L-1))/\lambda]-1}{\exp[i2\pi((n+ik-1)(h/(L-1))/\lambda \mp m/L)]-1} \dfrac{\exp[\mp i2\pi m/L]-1}{\mp i2\pi m}, & m \neq 0 \\ \dfrac{\exp[i2\pi(n+ik-1)(hL/(L-1))/\lambda]-1}{\exp[i2\pi(n+ik-1)(h/(L-1))/\lambda]-1} \dfrac{1}{L}, & m = 0 \end{cases}$ ($L$-level blazed; $\pm(n-1) > 0$) | Eq. 5.10 |
| $\tau_m = \begin{cases} \dfrac{\exp\left[i2\pi\dfrac{(n+ik-1)\lambda_D}{\|n_D-1\|\lambda}\right]-1}{\exp\left[\dfrac{i2\pi}{L}\left(\dfrac{(n+ik-1)\lambda_D}{\|n_D-1\|\lambda} \mp m\right)\right]-1} \dfrac{\exp[\mp i2\pi m/L]-1}{\mp i2\pi m}, & m \neq 0 \\ \dfrac{\exp\left[i2\pi\dfrac{(n+ik-1)\lambda_D}{\|n_D-1\|\lambda}\right]-1}{\exp\left[\dfrac{i2\pi}{L}\dfrac{(n+ik-1)\lambda_D}{\|n_D-1\|\lambda}\right]-1} \dfrac{1}{L}, & m = 0 \end{cases}$ ($L$-level blazed; $\pm(n-1) > 0$; $h=(\lambda_D/\|n_D-1\|)(L-1)/L$) | Eq. 5.11 |

FIG. 4B

| | |
|---|---|
| $c_t = -\lambda\, p_0'' - (n-1)\, t_0''$    (FIG. 7 achromat) | Eq. 7.1 |
| $p_0'' + n_D'\, t_0'' = 0$ | Eq. 7.2 |
| $n' = \dfrac{dn}{d\lambda}, \quad n_D' = \dfrac{dn}{d\lambda}\bigg|_{\lambda=\lambda_D}$ | Eq. 7.3 |
| $p_0'' = \dfrac{-n_D'\, c_{tD}}{\lambda_D\, n_D' - (n_D - 1)}$ | Eq. 7.4 |
| $t_0'' = \dfrac{c_{tD}}{\lambda_D\, n_D' - (n_D - 1)}$ | Eq. 7.5 |
| $c_t = \left(1 + \dfrac{(\lambda - \lambda_D)\, n_D' - (n - n_D)}{\lambda_D\, n_D' - (n_D - 1)}\right) c_{tD} \cong \left(1 - \dfrac{\frac{1}{2}(\lambda - \lambda_D)^2\, n_D''}{\lambda_D\, n_D' - (n_D - 1)}\right) c_{tD}$    ($c_{tD} = NA/R$) | Eq. 7.6 |
| $n_D'' = \dfrac{d^2 n}{d\lambda^2}\bigg|_{\lambda=\lambda_D}$ | Eq. 7.7 |
| $\delta \cong R\left(\dfrac{c_t}{c_{tD}} - 1\right) \cong -R\, \dfrac{\frac{1}{2}(\lambda - \lambda_D)^2\, n_D''}{\lambda_D\, n_D' - (n_D - 1)}$    (FIG. 7 achromat) | Eq. 7.8 |
| $\max|\delta| = 0.00028\, R$    (FIG. 7, $|\lambda - 13.5\text{nm}| \leq 0.01 \cdot 13.5\text{nm}$) | Eq. 7.9 |
| $d = \dfrac{R}{k(1-k)\, NA}$ | Eq. 8.1 |
| $t_0'' = \begin{cases} -k\, NA/((n_D-1)R), & \text{element } \mathbf{801} \\ (1-k)^2\, NA/(k\,(n_D-1)R), & \text{element } \mathbf{802} \\ -NA/((n_D-1)R), & \text{element } \mathbf{803} \\ NA/((n_D-1)R), & \text{element } \mathbf{804} \end{cases}$ | Eq. 8.2 |
| $c_t = c_{tD}\left(1 + \dfrac{(1-k)(n - n_D)^2}{((n-1) - (1-k)(n_D - 1))(n_D - 1)}\right) \cong c_{tD}\left(1 + \dfrac{(1-k)}{k}\left(\dfrac{(\lambda - \lambda_D)\, n_D'}{n_D - 1}\right)^2\right)$<br>(at element 802; $c_{tD} = \dfrac{-1}{k^2 d}$) | Eq. 8.3 |

FIG. 4C

| | |
|---|---|
| $\delta \cong \frac{k}{1-k} R\left(\frac{c_t}{c_{tD}} - 1\right) \cong R\left(\frac{(\lambda - \lambda_D) n'_D}{n_D - 1}\right)^2$ (FIG. 8A Schupmann refractive doublet) | Eq. 8.4 |
| $\max\|\delta\| = 0.00081 R$ (FIG. 8A, $\|\lambda - 13.5\text{nm}\| \leq 0.01 \cdot 13.5\text{nm}$) | Eq. 8.5 |
| $\|E\|^2 \cong 10^{-k \cdot NA \cdot R/(0.0586 \mu m)}$ (FIG. 8A) | Eq. 8.6 |
| $p''_0 = \begin{cases} \frac{-k\,NA}{\lambda_D R}, & \text{element } \mathbf{1001} \\ \frac{(1-k)^2 NA}{k \lambda_D R}, & \text{element } \mathbf{1002} \end{cases}$ | Eq. 10.1 |
| $c_t = c_{tD}\left(1 + \frac{(1-k)(\lambda - \lambda_D)^2}{(\lambda - (1-k)\lambda_D)\lambda_D}\right) \cong c_{tD}\left(1 + \frac{(1-k)}{k}\left(\frac{\lambda}{\lambda_D} - 1\right)^2\right)$ $(c_{tD} = \frac{-1}{k^2 d})$ | Eq. 10.2 |
| $\delta \cong \frac{k}{1-k} R\left(\frac{c_t}{c_{tD}} - 1\right) \cong R\left(\frac{\lambda}{\lambda_D} - 1\right)^2$ (FIG. 10 Schupmann diffractive doublet) | Eq. 10.3 |
| $\max\|\delta\| = 0.00010 R$ (FIG. 10, $\|\lambda - 13.5\text{nm}\| \leq 0.01 \cdot 13.5\text{nm}$) | Eq. 10.4 |
| $c_r = c_i + 2 t''_0$ | Eq. 15.1 |
| $\rho \cong \exp[-i 4\pi t / \lambda]$, $E_r = \rho E_i$ | Eq. 15.2 |
| $c_r = c_i - \lambda p''_0$ | Eq. 16.1 |
| $\rho = \sum_m \rho_m \exp[i 2\pi m p]$, $\rho_m = \int_0^1 \rho \exp[-i 2\pi m p] dp$ | Eq. 16.2 |
| $z = \frac{c r^2}{1 + \sqrt{1 - c^2 r^2}} + a_4 r^4 + a_6 r^6 + a_8 r^8 + a_{10} r^{10}$; $z = \text{x1} - \text{x1c}$; $r^2 = \text{x2}^2 + \text{x3}^2$ | Eq. 18.1 |
| $I = \left\| NA \frac{J_1[\frac{2\pi}{\lambda} NA\, r]}{\frac{2\pi}{\lambda} r} - NA\_inner \frac{J_1[\frac{2\pi}{\lambda} NA\_inner\, r]}{\frac{2\pi}{\lambda} r} \right\|^2$ | Eq. 21.1 |
| L1 x1_offset = $(k^2 - 1) d$ | Eq. 22.1 |
| L2 x1_offset = $k^2 d$ | Eq. 22.2 |
| $p = \sum_{j,k} a_{j,k} (x_2 - \mathbf{x2c})^j (x_3 - \mathbf{x3c})^k$ | Eq. 22.3 |

FIG. 4D

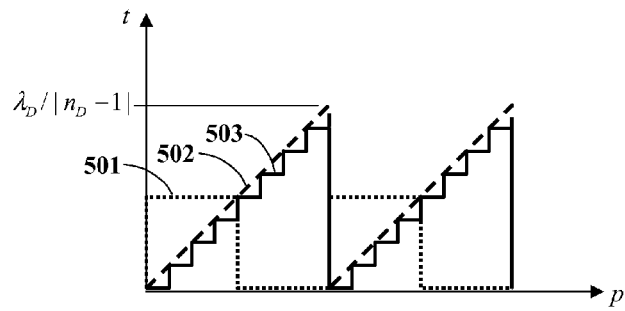

FIG. 5

| Mo grating efficiency at wavelengths $0.99\lambda_D$, $\lambda_D$, and $1.01\lambda_D$ ($\lambda_D = 13.5$ nm) | | | | | | |
|---|---|---|---|---|---|---|
| | Transmission grating ($|\tau_m|^2$) | | | Reflection grating ($|\rho_m|^2$) | | |
| Profile | 501 | 502 | 503 | 501 | 502 | 503 |
| $h$ (nm) | 88.6 | 177.2 | 155.0 | 3.38 | 6.75 | 5.91 |
| $m = -2$ | 0<br>0<br>0 | 0.00048106<br>0.00047679<br>0.0005192 | 0.00067151<br>0.00067118<br>0.00073732 | 0<br>0<br>0 | 0.000011257<br>0<br>0.000010961 | 0.000014888<br>0<br>0.000014398 |
| $m = -1$ | 0.31852<br>0.31634<br>0.31342 | 0.001088<br>0.0010717<br>0.0011598 | 0.0013533<br>0.0013411<br>0.0014607 | 0.40518<br>0.40528<br>0.40519 | 0.000025243<br>0<br>0.000024744 | 0.000029639<br>0<br>0.000028928 |
| $m = 0$ | 0.013437<br>0.013575<br>0.015107 | 0.0044109<br>0.0042641<br>0.0045299 | 0.0049413<br>0.0047963<br>0.0051176 | 0.00025173<br>0<br>0.00024186 | 0.000099966<br>0<br>0.000099968 | 0.00010538<br>0<br>0.00010516 |
| $m = 1$ → | 0.31852<br><u>0.31634</u><br>0.31342 | 0.61131<br><u>0.60218</u><br>0.5909 | 0.61876<br><u>0.61085</u><br>0.60087 | 0.40518<br><u>0.40528</u><br>0.40519 | 0.99966<br><u>1</u><br>0.99968 | 0.94933<br><u>0.94964</u><br>0.94934 |
| $m = 2$ | 0<br>0<br>0 | 0.0041007<br>0.0042641<br>0.0048776 | 0.0037378<br>0.0038877<br>0.0044493 | 0<br>0<br>0 | 0.00010409<br>0<br>0.000096086 | 0.000088752<br>0<br>0.000082099 |
| $m = 3$ | 0.035392<br>0.035149<br>0.034824 | 0.0010489<br>0.0010717<br>0.0012037 | 0.00085155<br>0.00086852<br>0.000974 | 0.04502<br>0.045032<br>0.045021 | 0.000025759<br>0<br>0.000024259 | 0.000019501<br>0<br>0.000018445 |
| $m = 4$ | 0<br>0<br>0 | 0.00046944<br>0.00047679<br>0.00053224 | 0.00033178<br>0.00033559<br>0.00037315 | 0<br>0<br>0 | 0.00001141<br>0<br>0.000010817 | 0.0000074932<br>0<br>0.0000071528 |

FIG. 6

| Projection system design data (*: pre-specified) | | | | |
|---|---|---|---|---|
| | | FIG. 17A | FIG. 17B | FIG. 17C |
| NA* | | 0.3 | 0.3 | 0.5 |
| NA_inner | | 0.17426 | 0.11942 | 0.30149 |
| dcmag* | | 10X | 10X | 10X |
| ap0 (mm) | | 50*sqrt(2) | 50*sqrt(2) | 50*sqrt(2) |
| ap1 (mm) | | 85.1571 | 95.4477 | 86.0467 |
| ap2* (mm) | | 250 | 250 | 250 |
| ap3* (mm) | | 5*sqrt(2) | 5*sqrt(2) | 5*sqrt(2) |
| Obj. | x1c (mm) | -2834.388194515894 | -3093.514492883296 | -1718.487407621044 |
| | $c$ (mm$^{-1}$) | 0.0003490494928743454 | -0.0002133914143446774 | 0.000575596956347796 |
| | $a_4$ (mm$^{-3}$) | 5.920913988296598e-013 | -9.505026216219767e-012 | 1.962683078572077e-013 |
| | $a_6$ (mm$^{-5}$) | -7.091761700733065e-017 | 4.57064097529864e-017 | -3.937331868759202e-018 |
| M1 | x1c (mm) | -117.8451647479794 | -45.22286813950265 | -70.17175532739614 |
| | $c$ (mm$^{-1}$) | 0.001246089189332208 | 0.0009152669771666197 | 0.002032699469009657 |
| | $a_4$ (mm$^{-3}$) | 1.401327610524209e-009 | 9.790533415764673e-010 | 6.370496115072404e-009 |
| | $a_6$ (mm$^{-5}$) | 7.157020135773122e-015 | 3.818120590443013e-015 | 7.549344352196384e-014 |
| | $a_8$ (mm$^{-7}$) | 5.341285696687554e-020 | 2.241436603855682e-020 | 2.706419386176457e-018 |
| M2 | x1c (mm) | -807.6088623363265 | -805.2685782068209 | -482.0359408745898 |
| | $c$ (mm$^{-1}$) | 0.00110016859468447 | 0.001029637414090786 | 0.001836127669616021 |
| | $a_4$ (mm$^{-3}$) | 2.051171402732098e-011 | 1.797812804942201e-011 | 9.756073296027759e-011 |
| | $a_6$ (mm$^{-5}$) | 2.897729532816132e-017 | 2.280059989796847e-017 | 3.969478801682418e-016 |
| | $a_8$ (mm$^{-7}$) | 3.613552250273872e-023 | 2.589722507394208e-023 | 8.783322165052528e-022 |
| | $a_{10}$ (mm$^{-9}$) | 5.53903798107254e-029 | 2.993453518735757e-029 | 1.044491074405305e-026 |
| z_focus (mm) | | 0 | 0.12 | 0 |
| z_fold (mm) | | -0.18 | -0.11 | -1.5 |

FIG. 18

Design Data for Microlens Element L1

| | | | | | |
|---|---|---|---|---|---|
| x1_offset | -1 | $a_{6,0}$ | 9.665216549073e+011 | $a_{4,6}$ | 4.324138129903e+019 |
| x1c | -3.095048563983e+003 | $a_{1,6}$ | -3.134802121982e+014 | $a_{6,4}$ | 3.487545895930e+020 |
| x2c | 7.073254237715e+001 | $a_{3,4}$ | -2.855942764418e+014 | $a_{8,2}$ | 2.794840573581e+020 |
| x3c | 0 | $a_{5,2}$ | 4.509175727196e+013 | $a_{10,0}$ | 6.719273287966e+019 |
| $a_{0,2}$ | -5.828404447658e+004 | $a_{7,0}$ | 6.763493796948e+013 | $a_{1,10}$ | -9.803897275937e+021 |
| $a_{2,0}$ | -5.334225753021e+004 | $a_{0,8}$ | 1.331743594091e+016 | $a_{3,8}$ | -2.298459389109e+022 |
| $a_{1,2}$ | -2.916372450290e+005 | $a_{2,6}$ | 1.587424498470e+016 | $a_{5,6}$ | -1.707244717834e+022 |
| $a_{3,0}$ | 1.739542070602e+005 | $a_{4,4}$ | -1.936106124964e+016 | $a_{7,4}$ | -1.355069926226e+021 |
| $a_{0,4}$ | 5.278380503636e+007 | $a_{6,2}$ | -3.344672386511e+016 | $a_{9,2}$ | 3.453999881730e+021 |
| $a_{2,2}$ | -1.350616274859e+007 | $a_{8,0}$ | -1.138549050099e+016 | $a_{11,0}$ | 1.079760197773e+021 |
| $a_{4,0}$ | -4.861548133895e+007 | $a_{1,8}$ | 2.870600267515e+018 | $a_{0,12}$ | 2.463621725430e+023 |
| $a_{1,4}$ | 1.532819033937e+010 | $a_{3,6}$ | 4.661702096327e+018 | $a_{2,10}$ | 7.297036953238e+023 |
| $a_{3,2}$ | 3.056044303889e+009 | $a_{5,4}$ | 1.547469995526e+018 | $a_{4,8}$ | 3.315912897231e+023 |
| $a_{5,0}$ | -4.956796257994e+009 | $a_{7,2}$ | -8.471288687128e+017 | $a_{6,6}$ | -1.050771447440e+024 |
| $a_{0,6}$ | -1.027423734787e+012 | $a_{9,0}$ | -4.360345426112e+017 | $a_{8,4}$ | -1.583193196037e+024 |
| $a_{2,4}$ | -3.810196350555e+011 | $a_{0,10}$ | -8.983738789763e+019 | $a_{10,2}$ | -8.440198741330e+023 |
| $a_{4,2}$ | 1.627628691837e+012 | $a_{2,8}$ | -1.854559921619e+020 | $a_{12,0}$ | -1.572801043467e+023 |

FIG. 23A

Design Data for Microlens Element L2

| | | | | | |
|---|---|---|---|---|---|
| `x1_offset` | 1/3 | $a_{6,0}$ | -1.929563403212e+011 | $a_{4,6}$ | 3.887786480591e+020 |
| `x1c` | -3.093714789797e+003 | $a_{1,6}$ | -1.706965210573e+014 | $a_{6,4}$ | 3.377058130243e+020 |
| `x2c` | 7.070335704453e+001 | $a_{3,4}$ | -4.209100718963e+014 | $a_{8,2}$ | 7.177892794769e+019 |
| `x3c` | 0 | $a_{5,2}$ | -3.215708203806e+014 | $a_{10,0}$ | -7.742041024895e+018 |
| $a_{0,2}$ | 5.244513371738e+004 | $a_{7,0}$ | -7.318440135398e+013 | $a_{1,10}$ | 4.773771431564e+021 |
| $a_{2,0}$ | 5.850704499769e+004 | $a_{0,8}$ | -4.173262431747e+015 | $a_{3,8}$ | 1.131942830029e+022 |
| $a_{1,2}$ | -5.284720399538e+005 | $a_{2,6}$ | -3.929815476337e+016 | $a_{5,6}$ | 8.072153810162e+021 |
| $a_{3,0}$ | -1.896891953878e+005 | $a_{4,4}$ | -5.084597318855e+016 | $a_{7,4}$ | 2.490324591193e+020 |
| $a_{0,4}$ | -1.808851445585e+007 | $a_{6,2}$ | -1.528071136324e+016 | $a_{9,2}$ | -1.603014712489e+021 |
| $a_{2,2}$ | -3.893606848675e+007 | $a_{8,0}$ | 1.456343699416e+015 | $a_{11,0}$ | -4.211507552204e+020 |
| $a_{4,0}$ | -2.745905412587e+007 | $a_{1,8}$ | 5.741329000201e+016 | $a_{0,12}$ | 4.730893920923e+023 |
| $a_{1,4}$ | 1.705207964177e+010 | $a_{3,6}$ | 1.389195349880e+018 | $a_{2,10}$ | 9.198611700623e+023 |
| $a_{3,2}$ | 2.132335540616e+010 | $a_{5,4}$ | 2.716484286626e+018 | $a_{4,8}$ | 2.233872807173e+023 |
| $a_{5,0}$ | 5.699728750226e+009 | $a_{7,2}$ | 1.756608008182e+018 | $a_{6,6}$ | -6.895015982265e+023 |
| $a_{0,6}$ | 1.135430881890e+012 | $a_{9,0}$ | 3.619276650740e+017 | $a_{8,4}$ | -5.085635621036e+023 |
| $a_{2,4}$ | 2.859776030656e+012 | $a_{0,10}$ | -5.692372086822e+019 | $a_{10,2}$ | -2.868227017183e+022 |
| $a_{4,2}$ | 1.159636384119e+012 | $a_{2,8}$ | 8.678435802050e+019 | $a_{12,0}$ | 2.888586990019e+022 |

FIG. 23B

SCANNED-SPOT-ARRAY EUV LITHOGRAPHY SYSTEM

CROSS-REFERENCE TO RELATED APPLICATION(S)

This application claims the benefit under 35 U.S.C. §119 (e) of the following two applications, both of which name Kenneth C. Johnson as the inventor, and both of which are incorporated by reference in their entirety for all purposes:

U.S. Provisional Patent Application No. 61/618,584, filed Mar. 30, 2012 for "Scanned-Spot-Array EUV Lithography System;" and U.S. Provisional Patent Application No. 61/675,709, filed on Jul. 25, 2012 for "Scanned-Spot-Array EUV Lithography System".

This application incorporates by reference, for all purposes, the entire disclosures (including any attached documents) of the following applications, all naming Kenneth C. Johnson as the inventor:

U.S. patent application Ser. No. 13/103,874, filed May 9, 2011 for "Optical Systems and Methods for Absorbance Modulation;"

U.S. Provisional Patent Application No. 61/498,427, filed Jun. 17, 2011 for "Scanned-Spot-Array Optical Lithography;"

U.S. Provisional Patent Application No. 61/521,684, filed on Aug. 9, 2011 for "Scanned-Spot-Array Optical Lithography;"

U.S. patent application Ser. No. 13/198,512, filed Aug. 4, 2011 for "Stacked-Grating Light Modulator;"

U.S. Provisional Patent Application No. 61/525,125, filed on Aug. 18, 2011 for "Spot-Array Imaging System for Maskless Lithography and Parallel Confocal Microscopy;"

U.S. Provisional Patent Application No. 61/531,981, filed on Sep. 7, 2011 for "Spot-Array Imaging System for Maskless Lithography and Parallel Confocal Microscopy;"

U.S. Provisional Patent Application No. 61/549,158, filed on Oct. 19, 2011 for "Spot-Array Imaging System for Maskless Lithography and Parallel Confocal Microscopy;" and U.S. patent application Ser. No. 13/523,843, filed Jun. 14, 2012 for "Spot-Array Imaging System for Maskless Lithography and Parallel Confocal Microscopy" (the '843 application).

This disclosure pertains to EUV (extreme ultraviolet) embodiments of the '843 invention. Additional prior-art references cited in the disclosure are listed in the "References" section.

BACKGROUND OF THE INVENTION

Scanned-Spot-Array Optical Lithography is a maskless lithographic printing method in which an array of diffraction-limited focused-radiation spots is raster-scanned over a printing surface (a photosensitive optical recording medium) to synthesize a high-resolution recorded image. The spots may be individually modulated by a spatial light modulator. Alternatively, the spots are not individually modulated, but are collectively modulated by a single modulator.

Maskless EUV systems employing scanned-spot arrays are described in U.S. Pat. Nos. 6,498,685 and 7,116,405. In these systems, the spots are generated by very small EUV-transmitting microlenses of comparatively high numerical aperture (NA) in close proximity to the printing surface. Such systems would have limited practicality due to the low optical efficiency, nonuniform transmittance, and chromatic dispersion of high-NA EUV microlenses, as well as the complication of maintaining accurate positioning of a large-area microlens array very close to the printing surface.

The '843 application discloses an alternative scanned-spot-array system in which the spots are generated at the object surface of a projection lens, and are imaged by the lens onto a printing surface at reduced magnification. This makes it possible to use comparatively simple, low-NA microlenses for spot generation. Moreover, the microlenses can be configured to offset and neutralize geometric optical aberrations in the projection lens. But the utility of this type of system for EUV lithography would still be limited by the inefficiency, nonuniform transmittance, and chromatic dispersion of EUV microlenses. The '843 application describes an EUV embodiment using spatially-filtered, zone-plate microlenses, which would partially alleviate but not fully overcome these limitations. Reflective microlenses (i.e., micromirrors) do not suffer these limitations, but the micromirror embodiment illustrated in '843 FIG. 32 is not configured for EUV lithography. The '843 application further notes that "Micromirrors have the disadvantage that the focused spots cannot be spatially filtered . . . because such [spatial filter] apertures would interfere with the illumination optical path."

SUMMARY OF THE INVENTION

The limitations of EUV microlenses can be alleviated by using paired combinations of lens elements in a manner similar to either a two-glass achromat or a Schupmann-type single-glass achromat. For example, the theoretical efficiency limit of a molybdenum (Mo) phase-Fresnel Schupmann doublet operating at 13.5 nm is 36% (i.e., 60% for each element). The efficiency would be uniform across the lens aperture, and the focal length shift from chromatic dispersion would be less than 0.01% over a 2% wavelength bandwidth. In an illustrative embodiment, the microlens aperture diameters are 22 µm; each lens has six Fresnel facets; the facet heights are 177 nm; and the minimum facet width is 900 nm. Each doublet focuses EUV illumination into a 0.03-NA divergent beam, which is projected by 10× reduction optics into a 0.3-NA, point-convergent beam at the printing surface.

In an alternative approach, the spot-generation optics comprise reflective microlenses (i.e. micromirrors) in a Cassegrain-type optical configuration with an approximately paraboloidal primary and flat secondary. The Cassegranian-type geometry does not require beam-splitting optics and avoids the problem with beam interference noted in the '843 application. In a preferred embodiment, a 0.3-NA EUV system operating at a 13.5-nm wavelength uses micromirrors having a diameter of approximately 22 µm and sag of 65 nm. The contoured mirror surfaces are coated with a conventional EUV multilayer reflection coating. As in the preceding example, the numerical aperture is 0.03 at the object surface and 0.3 at the printing image plane.

The surface height of the micromirrors can be reduced by using phase-Fresnel micromirrors, which would have a facet step height of only 6.75 nm at a 13.5-nm operating wavelength. Phase-Fresnel micromirrors can be used in pairs, in a manner similar to a Schupmann doublet, to achieve substantially achromatic focusing performance.

The projection optics comprise two multilayer EUV mirrors in a configuration similar to a flat-image Schwarzschild objective with a finite-conjugate object. The object surface need not be constrained to be flat. Also, distortion is not a limitation because the distribution of source spots need not be periodic—it can be determined to match any distortion pattern. Furthermore, geometric imaging aberrations can be tolerated because the spot-generation optics are configured to counterbalance and nullify point-imaging aberrations in the projection system.

In one embodiment, the illumination optics between the EUV source and the spot-generation optics comprise two collection mirrors, including a near-normal-incidence multilayer mirror and a grazing-incidence mirror. A single EUV source such as a laser-produced plasma (LPP) source could provide illumination simultaneously to multiple scanners.

This disclosure pertains primarily to EUV systems operating at a 13.5-nm wavelength, but the invention is equally applicable to x-ray lithography at wavelengths "Beyond EUV" (BEUV), such as 6.7-nm systems that are currently under development (Ref 8). The invention would also be applicable to DUV (deep ultraviolet) and visible-light lithography systems and high-resolution printers, particularly if broadband radiation is used.

A further understanding of the nature and advantages of the present invention may be realized by reference to the remaining portions of the specification and the drawings, which are intended to be exemplary and not limiting.

BRIEF DESCRIPTION OF THE DRAWINGS

FIGS. 4A-4D tabulate equations that are referenced in this disclosure;

FIG. 5 illustrates several alternative diffractive surface relief patterns (surface height versus grating phase) that can be used for diffractive lenses—both transmitting and reflective;

FIG. 6 tabulates EUV diffraction efficiency data for diffractive lenses—both transmitting and reflective—for the profile shapes illustrated in FIG. 5;

FIG. 18 tabulates optical design data for the systems of FIGS. 17A-17C;

FIGS. 23A and 23B tabulate microlens design data for the FIG. 22 configuration;

DESCRIPTION OF SPECIFIC EMBODIMENTS

The Projection Optics

Figure 1A:
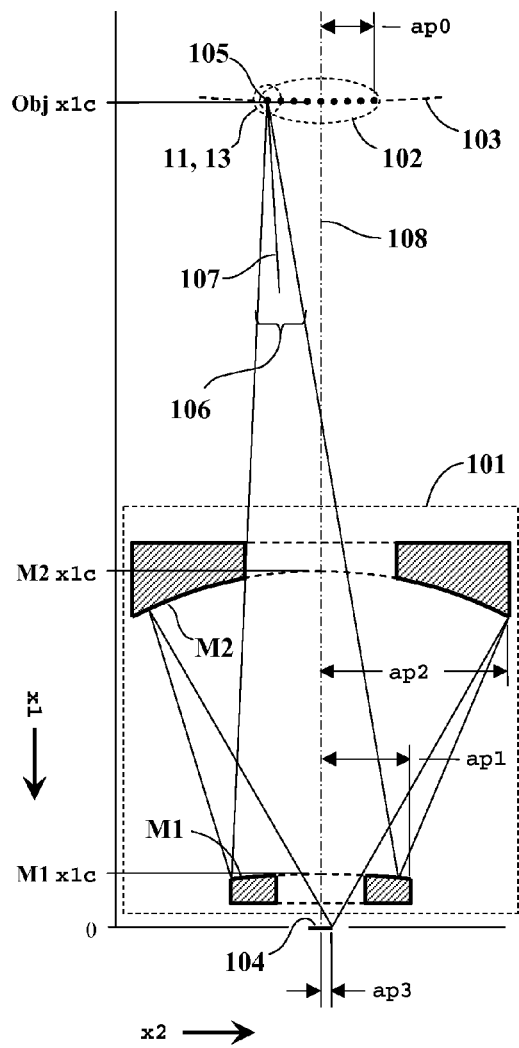
FIGS. 1A and 1B are conceptual cross-sectional schematics of a flat-image Schwarzschild projection system.
Figure 1B:
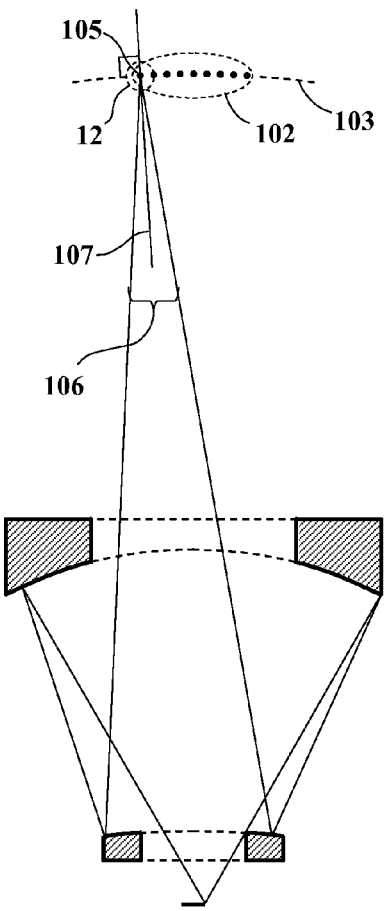

FIGS. 1A and 1B conceptually illustrate the EUV projection optics 101, which comprise axially-symmetric, annular, aspheric mirrors M1 and M2 (shown in cross section) in a flat-image Schwarzschild configuration. (See p. 18.15 in Ref. 2.) The mirror surfaces have multilayer EUV reflectance coatings. Spot-generation optics partition incident radiation into separate beams diverging from discrete object spots 102 on an object surface 103. Mirrors M1 and M2 image the object spots onto conjugate image points on an image plane 104 at reduced magnification. The spot-generation optics compensate for geometric point-imaging aberrations in the projection optics, enabling substantially diffraction-limited imaging performance over the full image field. A photosensitive layer at the image plane is raster-scanned as the spots are intensity-modulated to synthesize a high-resolution printed image from the point exposures. (A possible scan pattern is illustrated in the '843 application FIG. 2.)

In the FIG. 1A embodiment the object surface shape is unconstrained and is optimized to minimize point-imaging aberrations. In FIG. 1B the object surface is constrained to be normal to the chief ray at each spot. For example, the EUV radiation cone emanating from spot 105 is illustrated as 106, and the chief ray 107 at the center of this cone is orthogonal to the object surface 103 in FIG. 1B but not in FIG. 1A. (Chief ray 107 is only a design construction ray. It is not a real ray because it does not intercept annular mirrors M1 and M2 and is obscured in the spot-generation optics.) The orthogonality constraint simplifies the spot-generation optics in some preferred embodiments, which will be described below. But there are two tradeoffs to this advantage: First, the shape constraint increases optical aberrations; and second, the constraint moves the optimal M1 position further from the image 104, resulting in a larger central obscuration.

A flat-image Schwarzschild system is similarly used in the Lawrence Berkeley Laboratory's EUV micro-exposure tool (MET, Ref 5). The MET image field is very small (a fraction of 1 mm), whereas the illustrative embodiments disclosed herein have an image field diameter of $\sqrt{2} \cdot 10$ mm (sufficient to cover a 10-mm square field). However, this comparison is not meaningful because in the present invention the instantaneous image spots cover only a small fraction of the full image area. Three principal advantages of the invention over MET-type systems are that (1) the system is maskless; (2) the spot-generation optics eliminate geometric point-imaging aberrations entirely over all image spots; and (3) the partitioning of the image radiation into discrete spots eliminates coherent proximity effects in the scanned image.

A similar projection system is disclosed in U.S. Pat. No. 6,133,710. The '710 system achieves a large field of view with a two-mirror system, but it is adapted for mask lithography and is therefore corrected for field curvature (i.e., the object surface is flat), whereas there is no need to constrain the object surface shape in the present invention. The system disclosed in '710 does not correct distortion, and is therefore specifically limited to non-scanning systems, whereas the present invention operates in a scanning mode even with distortion in the projection system. (The object spot positional layout is configured to nullify image distortion.)

EUV-Transmitting Microlens Characteristics

Figure 2:
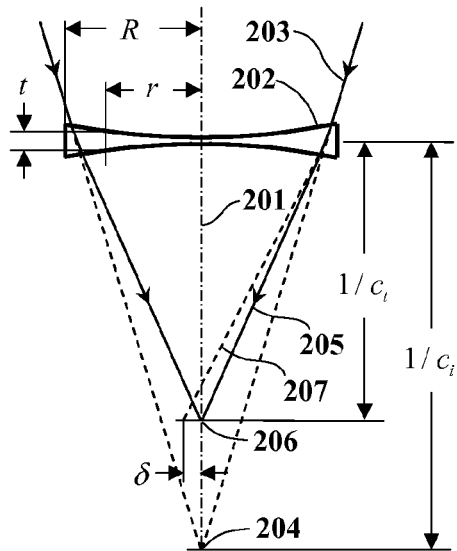
FIG. 2 illustrates a refractive, transmitting EUV microlens in cross-section.
Figure 3A:
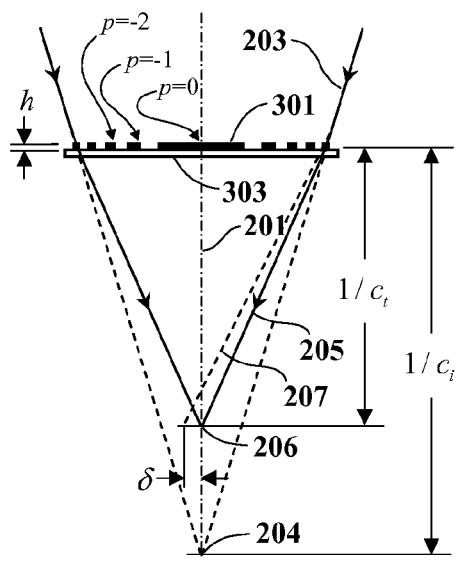
FIGS. 3A and 3B illustrate two types of diffractive, transmitting EUV microlenses in cross-section, a zone-plate lens and a phase-Fresnel lens.
Figure 3B:
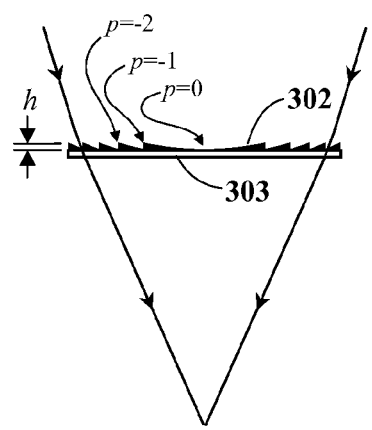

The object spot array 102 in FIGS. 1A and 1B can be generated using transmitting microlens elements such as those illustrated schematically in FIGS. 2, 3A and 3B. These elements are substantially axially-symmetric about axis 201, and are shown in cross-section in the figures. (They may deviate somewhat from axial symmetry to effect aberration compensation as described in the '843 application.) Equations describing the paraxial point-imaging and transmittance characteristics of such lenses are tabulated in FIGS. 4A-4D. (A more detailed and accurate optical prescription of the lenses would include aberration compensation.)

FIG. 2 illustrates a cross-sectional view of a thin EUV-transmitting microlens 202, which could be composed of molybdenum for operation at a 13.5-nm wavelength. At this wavelength the complex refractive index of Mo is 0.9238+0.006435i. For wavelengths $\lambda$ close to 13.5 nm the real and imaginary parts of the Mo refractive index (n and k, respectively) are described by Eq. 2.1. (Note: All equations referenced in this disclosure are tabulated in FIGS. 4A-4D. The first numeral in each equation identifier is the figure number with which the equation is most closely related, or in the context of which the equation is introduced.) Eq. 2.1 is based on CXRO online data (Ref 9), with Mo density of 10.22 gm/cm$^3$. n is less than 1, so a meniscus lens such as that illustrated in FIG. 2 will act as a converging element. (For DUV applications n is greater than 1 and the lens would be convex.)

The lens thickness t has an approximately quadratic dependence on radius r (cf. FIG. 2), as indicated by Eq. 2.2, where $t_0$ is the center thickness and $t''_0$ is the lens "thickness curvature," i.e., the difference between the two surface curvatures. (The surface curvatures are defined as the reciprocal surface spherical radii, and $t''_0$ is the second derivative of t with respect to r.) A spherical-wave incident beam, represented by edge ray 203 in FIG. 2, is convergent toward point 204. The incident wave curvature at the top lens surface FIG. 2 is $c_i$, the reciprocal distance from element 202 to point 204. The beam is refracted into an approximately spherical-wave transmitted beam, represented by refracted edge ray 205, which is directed toward point 206. The transmitted wave curvature $c_t$ is the reciprocal distance to point 206. Eq. 2.3 defines $c_t$ as a function of $c_i$, $t''_0$, and n in a paraxial approximation.

The curvatures $t''_0$, $c_i$, and $c_t$ are generally signed quantities, and are all positive as illustrated in FIG. 2. Wave curvatures are positive for converging waves and negative for diverging waves. The thickness curvature is positive for a meniscus lens (i.e., a converging lens if n<1, or diverging lens if n>1).

$c_t$ is a strong function of wavelength $\lambda$ due to the high dispersion of n. FIG. 2 illustrates two refracted edge rays 205 and 207 corresponding to different wavelengths. The rays are displaced by distance $\delta$ in the focal plane due to the index dispersion. The real parts of the refractive indices corresponding to rays 205 and 207 will be denoted as $n_D$ and n respectively (where "D" denotes a design condition), and the corresponding transmitted wave curvatures will be denoted as $c_{tD}$ and $c_t$. (The "$c_t$" notation in FIG. 2 is actually $c_{tD}$.) Assuming a substantially collimated incident beam ($c_i$=0), the dependence of $\delta$ on the refractive indices and aperture radius R has the approximate form given by Eq. 2.4. With application of Eq. 2.1, the maximum $\delta$ value over a 2% wavelength band at 13.5 nm is given by Eq. 2.5. This implies that for a lens of numerical aperture NA the chromatic dispersion will exceed the diffraction limit (i.e., $2\delta > \lambda/NA$) if R is larger than 0.2 μm/NA. (For example, at NA=0.03 the diffraction limit would be exceeded for R>7 μm.)

A thin lens can be modeled approximately as an infinitesimally thin phase shifting and attenuating layer whose complex amplitude transmittance $\tau$ as a function of radius r has the approximate form described by Eq. 2.6 for wavelength $\lambda$, where t is the physical thickness defined by Eq. 2.2. (Eq. 2.6 only accounts for bulk attenuation within the lens; it does not take into account surface reflections or substrate losses.) The transmittance factor is applied to the incident electric field amplitude $E_i$ at the layer to obtain the transmitted field $E_t$. The intensity transmittance $|\tau|^2$ is described by Eq. 2.7. The lens center thickness $t_0$ in Eq. 2.2 should preferably be very small to minimize the transmission loss. (A thin lens can be formed on a thin silicon substrate, which would exhibit much less EUV absorption than Mo; Ref. 7.) If $t_0$=0, then for a substantially collimated incident beam ($c_i$=0) the lens numerical aperture NA is defined by Eq. 2.8 (cf. Eq. 2.3) and the minimum intensity transmittance min $|\tau|^2$ (i.e. the transmittance at the lens edge) is described by Eq. 2.9. (This is obtained from Eq. 2.7 by eliminating $t''_0$ between Eq's. 2.2 and 2.8.) This indicates, for example, that a 0.03-NA lens of radius 1 μm would have an edge transmittance of less than 31%.

The low efficiency of refracting EUV microlenses can be avoided by using a diffractive lens such as a zone-plane lens 301 shown in cross section in FIG. 3A or a phase-Fresnel lens 302 shown in FIG. 3B. The lens comprises a substantially circular grating structure supported by a thin silicon substrate 303. (The zones would not be exactly circular if they are configured to effect aberration compensation.) The grating can be formed on either side (or on both sides) of the substrate. Also, a zone-plate lens could alternatively be supported by spider vanes as illustrated in the '843 application FIG. 17.

A grating is characterized by its phase distribution p, measured in cycle units (1 cycle=$2\pi$ radian). p varies by one unit per grating period. The sign convention for p is defined so that p increases in the direction of the first diffracted order relative to the zero order. For the converging lenses illustrated in FIGS. 3A and 3B p increases from the edge of the lens toward the center. For a diverging lens p increases from center to edge. (As in the case of the refractive lens of FIG. 2, the converging phase-Fresnel lens in FIG. 3B has a meniscus form because n is less than 1 at EUV wavelengths. For DUV applications with n>1 the Fresnel facets would be convex.)

The grating phase p has an approximately quadratic dependence on radius r, as indicated by Eq. 3.1, where $p_0$ is the phase at the lens center and $p''_0$ is the "phase curvature," i.e. the second derivative of p with respect to r. (The first derivative of p is the grating line density, and the grating period is the reciprocal of the line density.) A curvature-$c_i$ incident spherical wave, which is represented in FIG. 3A by edge ray 203 convergent toward point 204, will be diffracted into an approximately spherical, curvature-$c_t$ transmitted wave represented by edge ray 205, which is convergent to point 206. Eq. 3.2 defines $c_t$ as a function of $c_i$, $p''_0$, and wavelength $\lambda$. This equation applies equally well to the FIG. 3B structure. (Eq. 3.2 applies to the first diffracted order. A similar equation can be obtained for the m-th order by inserting a factor of m in front of $\lambda$ in Eq. 3.2.) In the illustrated configuration of FIGS. 3A and 3B, $c_i$ and $c_t$ are positive and $p''_0$ is negative.

FIG. 3A illustrates two diffracted edge rays 205 and 207 corresponding respectively to a design wavelengths $\lambda_D$ and a second wavelength $\lambda$. The rays are displaced by distance $\delta$ in the focal plane due to diffractive dispersion. With a substantially collimated incident beam ($c_i$=0), the dependence of $\delta$ on the wavelengths and aperture radius R has the approximate form given by Eq. 3.3. The maximum $\delta$ value over a 2% wavelength band at $\lambda_D$=13.5 nm is given by Eq. 3.4. (Note that this is almost three times smaller than the dispersion of an EUV refracting lens, Eq. 2.5.)

A diffraction grating's wave-shaping characteristic, described by Eq. 3.2, generally depends only on its phase distribution p and not on its surface-height profile. The height profile determines the grating's optical efficiency and the distribution of transmitted energy between diffraction orders. The grating thickness t, as a function of radius r, can be described by Eq. 5.1 for a zone-plate lens (FIG. 3A) and by Eq. 5.2 for a phase-Fresnel lens (FIG. 3B), where h is the maximum grating height and p is the phase defined by Eq. 3.1. (The function mod[x, 1] returns x minus the greatest integer less than or equal to x.) In Eq. 5.1 d is the grating "duty cycle" in the range 0<d<1, and in Eq. 5.2 the "±" is "+" or "−" for the two respective cases n>1 or n<1. In general h and d may have a weak functional dependence on p, in which case the grating structure might not be exactly periodic in p and the diffraction orders' wavefront shapes could depend on d and h as well as p.

An alternative to a phase-Fresnel grating is a multi-level blazed profile, which has the functional form defined by Eq. 5.3. The grating has a staircase profile with L surface levels and L−1 layers, each of thickness h/(L−1). FIG. 5 illustrates the surface height profiles 501, 502 and 503 represented by Eq's. 5.1, 5.2 and 5.3 respectively. (The height reference $\lambda_D/|n_D-1|$ in FIG. 5 is 177 nm for molybdenum and $\lambda_D$=13.5 nm.) Eq. 5.2 is equivalent to Eq. 5.3 in the limit that the number of levels L approaches infinity. Eq's. 5.1 and 5.3 are equivalent with $$d = \frac{1}{2}$$

and L=2, except that for the case n<1 the profile defined by Eq. 5.1 has a half-cycle phase shift relative to that of Eq. 5.3. (A constant phase shift can be subsumed in the $p_0$ term in Eq. 3.1.)

A low-profile diffractive lens can be modeled as an infinitesimally thin phase-shifting and attenuating layer whose complex amplitude transmittance r as a function of radius r has the form given approximately by Eq. 2.6, with the physical thickness t defined by Eq. 5.1, 5.2, 5.3, or some alternative periodic form. In these equations t is periodic in p with period 1, and hence r comprises a Fourier series defining discrete diffraction orders with amplitudes $\tau_m$, as indicated in Eq. 5.4. A transmittance factor $\tau_m \exp[i2\pi\, m\, p]$ is applied to the incident field amplitude $E_i$ to obtain the amplitude $E_{tm}$ of the m-th diffracted order at the diffractive layer (Eq. 5.5). The diffraction efficiency in the m-th order ($|E_{tm}/E_i|^2$) is $|\tau_m|^2$.

Under the assumed periodicity condition $\tau_m$ is independent of p. But if t is not exactly periodic in p (for example, if d or h has a weak functional dependence on p) then $\tau_m$ would exhibit some variation across the lens aperture. (The $\tau_m$ value at a particular p value can be obtained approximately by shifting the integration limits in Eq. 5.4 to $$p \pm \frac{1}{2}.)$$

In any case the zone-plate grating's order-m intensity transmittance $|\tau_m|^2$ has little or no dependence on aperture radius R, so aperture size does not limit efficiency as it does with a refracting lens (Eq. 2.9).

With application of Eq's 2.6 and 5.4, $\tau_m$ has the functional form described by Eq. 5.6 for a zone-plate grating profile (Eq. 5.1, profile 501 in FIG. 5). The first-order efficiency $|\tau_1|^2$ is maximized at design wavelength $\lambda_D$ (with corresponding n=$n_D$) when $$d = \frac{1}{2}$$

and h≅$\lambda_D/(2|n_D-1|)$ (approximately), in which case Eq. 5.6 reduces to Eq. 5.7. (With k non-zero the optimum h value is slightly lower than this estimate.)

For a phase-Fresnel lens (Eq. 5.2, profile 502 in FIG. 5), $\tau_m$ has the form described by Eq. 5.8. The first-order efficiency is maximized at design wavelength $\lambda_D$ (the "blaze wavelength") when h≅$\lambda_D/|n_D-1|$ (approximately), in which case Eq. 5.8 reduces to Eq. 5.9. (The top and bottom "±" and "∓" signs in the equations are correlated.)

Eq. 5.10 defines $\tau_m$ for a multi-level blazed grating (Eq. 5.3, profile 503 in FIG. 5). The approximate blaze condition for this case is h≅($\lambda_D/|n_D-1|$)(L−1)/L, for which Eq. 5.10 reduces to Eq. 5.11.

FIG. 6 tabulates the theoretical zone-plate efficiency $|\tau_m|^2$ for three wavelengths covering a 2% band centered at $\lambda_D$=13.5 nm, and in several diffraction orders m, for grating profiles 501 (Eq. 5.7), 502 (Eq. 5.9) and 503 (Eq. 5.11); cf. FIG. 5. (The top, middle, and bottom numbers in each box correspond to respective wavelengths 0.99 $\lambda_D$, $\lambda_D$, and 1.01 $\lambda_D$, The first-order efficiencies at $\lambda_D$ are underlined.) In all three cases the grating is assumed to have zero minimum thickness, and the efficiency values neglect substrate losses. The 8-level grating (profile 503) is slightly more efficient than the phase-Fresnel grating (profile 502) because it has lower average thickness. Its order-1 efficiency could be increased somewhat (from 61.1% to 63.6%) by uniformly reducing its thickness by 16 nm. The phase-Fresnel grating's efficiency can also be increased by a greater amount (from 60.2% to 66.5%) by reducing its thickness by 27 nm. (Portions of the original profile that are less than 27 nm thick would be reduced to zero thickness.) However, the efficiency in some other orders would also increase (e.g., the zero order would increase from 0.4% to 1.8%). Thus, the thinning may not be beneficial unless the other orders can be blocked. (The extraneous orders could be eliminated by stacking two phase-Fresnel gratings, such as a molybdenum grating on a silicon grating, to make $|\tau|$ constant across the grating profile. But this would significantly reduce efficiency in the first order.)

The above results show that diffractive EUV microlenses are superior to refractive microlenses in three respects: They have much higher efficiency for lenses of practical size; their efficiency is uniform across the lens aperture; and they exhibit much less chromatic dispersion, although the dispersion is nevertheless still a significant limitation.

Achromatization of EUV-Transmitting Microlenses

Figure 7:
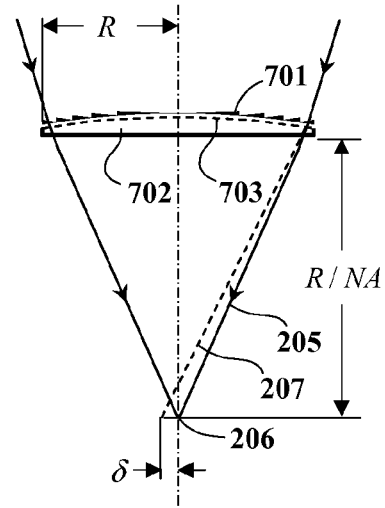
FIG. 7 illustrates an achromatic EUV microlens comprising a diffractive surface relief pattern (as illustrated, a phase-Fresnel lens) formed on a refractive lens.

A diffractive EUV lens can be combined with a refractive lens to form an achromatic doublet, similar in principle to a conventional two-glass achromat (such as that illustrated in FIG. 19 on p. 1.23 in Ref 2). FIG. 7 shows a cross-sectional schematic view of one such lens comprising a converging phase-Fresnel grating 701 formed on a diverging refractive lens 702. Element 701 could alternatively comprise a zone-plate or multi-level grating. The two elements are not necessarily separate physical components, but they can be modeled as two components separated by an imaginary surface 703 defining the grating substrate. Surface 703 can be thought of as a vacuum boundary layer of infinitesimal thickness.

The converging element 701 is characterized by a negative phase curvature $p''_0$ (Eq. 3.1), and the diverging element 702 (with n<1) is characterized by a negative thickness curvature $t''_0$ (Eq. 2.2). Assuming a substantially collimated incident beam, element 701 induces wave curvature $-\lambda\, p''_0$ in the boundary layer (Eq. 3.2 with $c_i=0$), and element 702 increments the curvature by $-(n-1)\,t''_0$ (Eq. 2.3). Thus the resultant transmitted-wave curvature $c_t$ after traversing both elements is given by Eq. 7.1. Narrow-band achromatization is achieved when the derivative of $c_t$ with respect to wavelength $\lambda$ is zero at a particular design wavelength $\lambda_D$. This condition leads to Eq. 7.2, where n' is the derivative $dn/d\lambda$ and $n'_D$ is n' evaluated at $\lambda=\lambda_D$ (Eq. 7.3). Eq. 7.1 (with $\lambda=\lambda_D$) and Eq. 7.2 are combined to solve for $p''_0$ and $t''_0$ (Eq's. 7.4, 7.5). All wavelength-dependent quantities in Eq's. 7.4 and 7.5 ($\lambda$, n, n', $c_t$) have "D" subscripts indicating that they are evaluated at $\lambda_D$. ($c_{t,d}$ is equal to NA/R, where R is the lens aperture radius and NA is the numerical aperture; cf. FIG. 7.) $p''_0$ and $t''_0$ are substituted from Eq's. 7.4 and 7.5 into Eq. 7.1 to obtain Eq. 7.6, in which a Taylor-series approximation is applied to obtain the right-hand result for $\lambda$ close to $\lambda_D$. $n''_D$ is $d^2n/d\lambda^2$ evaluated at $\lambda_D$ (Eq. 7.7).

With a collimated incident beam, the focal-plane deviation $\delta$ between edge rays 205 and 207 associated with wavelengths $\lambda_D$ and $\lambda$ (FIG. 7) is given approximately by Eq. 7.8. For a 2% wavelength band at $\lambda_D=13.5$ nm, Eq. 7.8 can be numerically evaluated with the help of Eq. 2.1 to obtain a maximum $\delta$ value, Eq. 7.9. The dispersion is two orders of magnitude smaller than that of a singlet lens, either refractive (Eq. 2.5) or diffractive (Eq. 3.4).

If lens 201 in FIG. 2 has zero center thickness and lens 702 in FIG. 7 has zero edge thickness, then the center thickness of lens 702 will be approximately half the edge thickness of lens 202 in FIG. 2 based on the $t''_0$ values implied by Eq. 2.3 (for FIG. 2, with $c_i=0$) and Eq. 7.5 (for FIG. 7, with $\lambda_D=13.5$ nm). The maximum efficiency of element 701 would be 32% for a zone-plate element, or 60% for a phase-Fresnel element (FIG. 6). Thus, the FIG. 7 doublet would compare favorably with the FIG. 2 singlet in terms of optical efficiency.

Figure 20A:
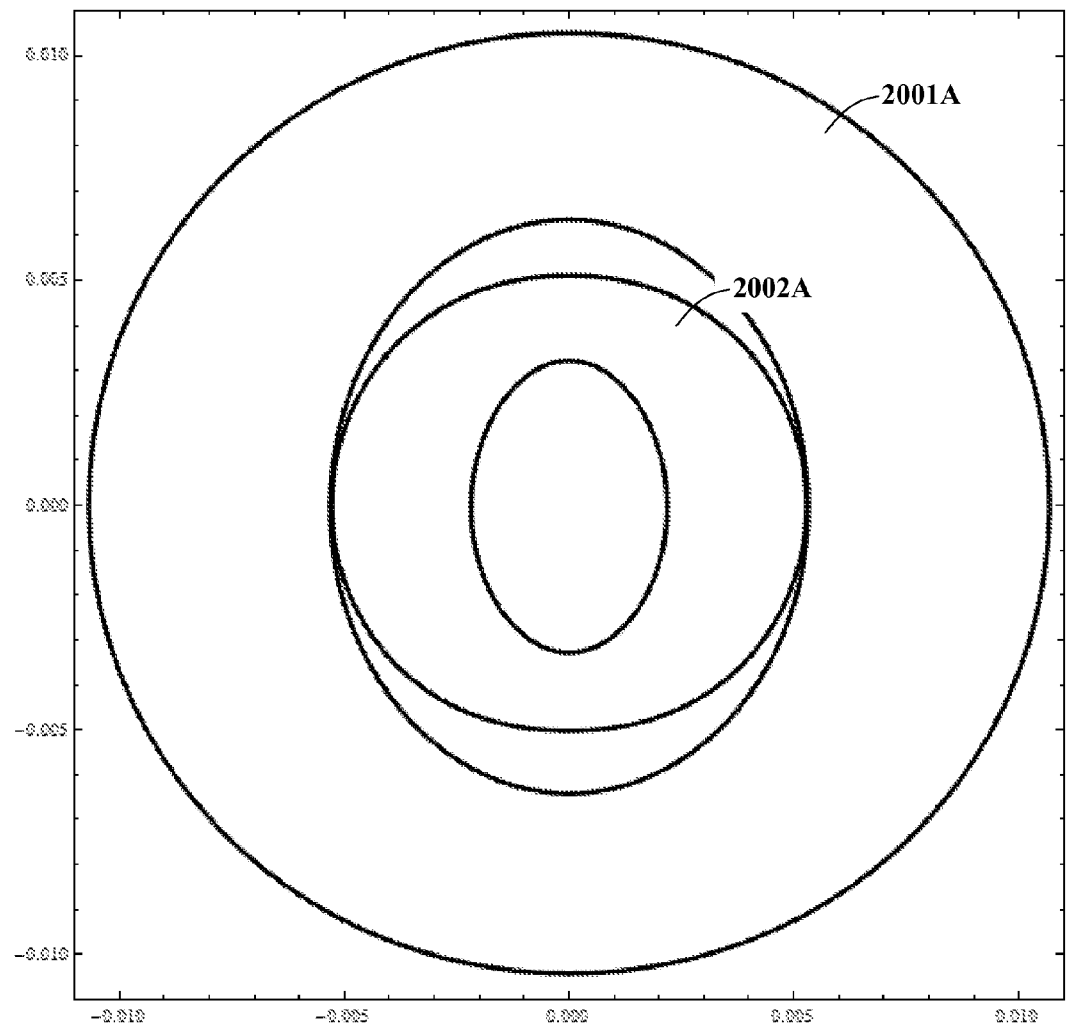
Figure 20B:
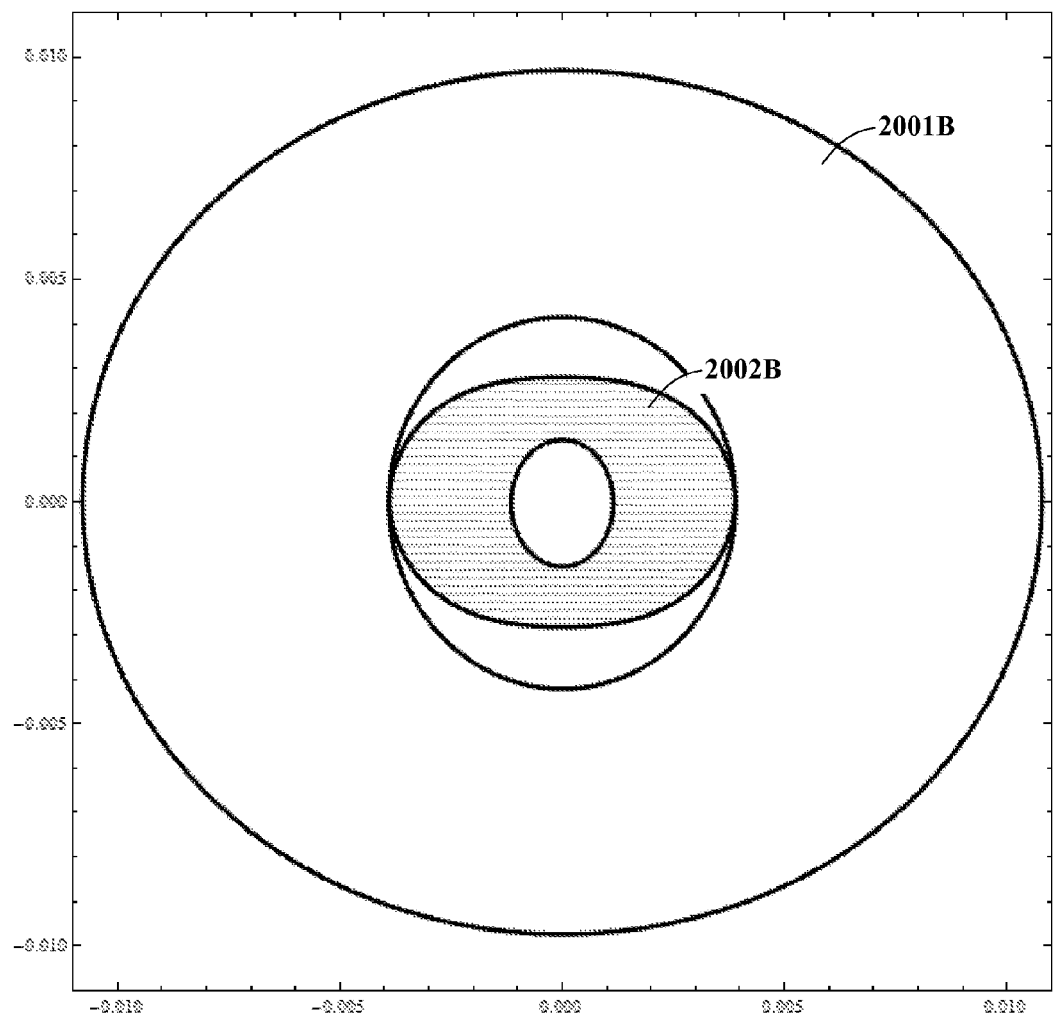
Figure 20C:
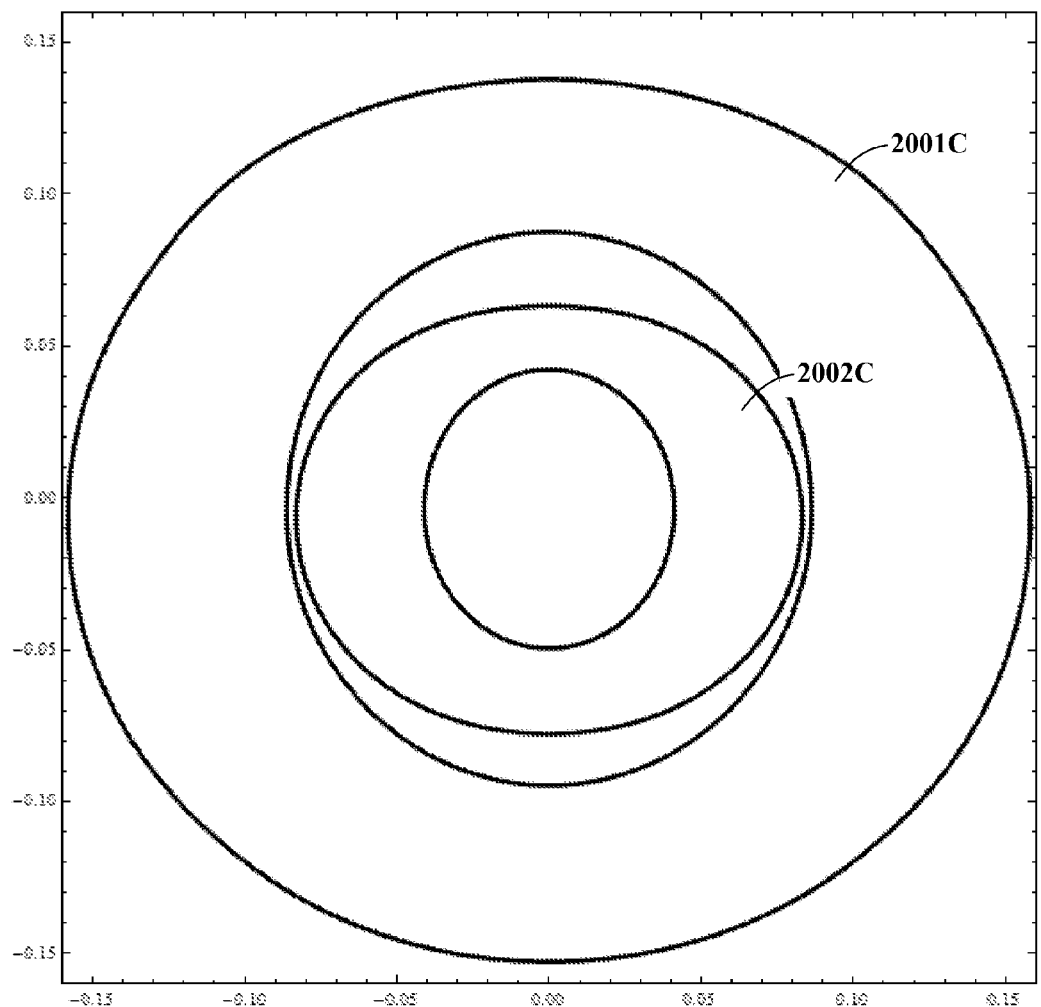
Figure 21:
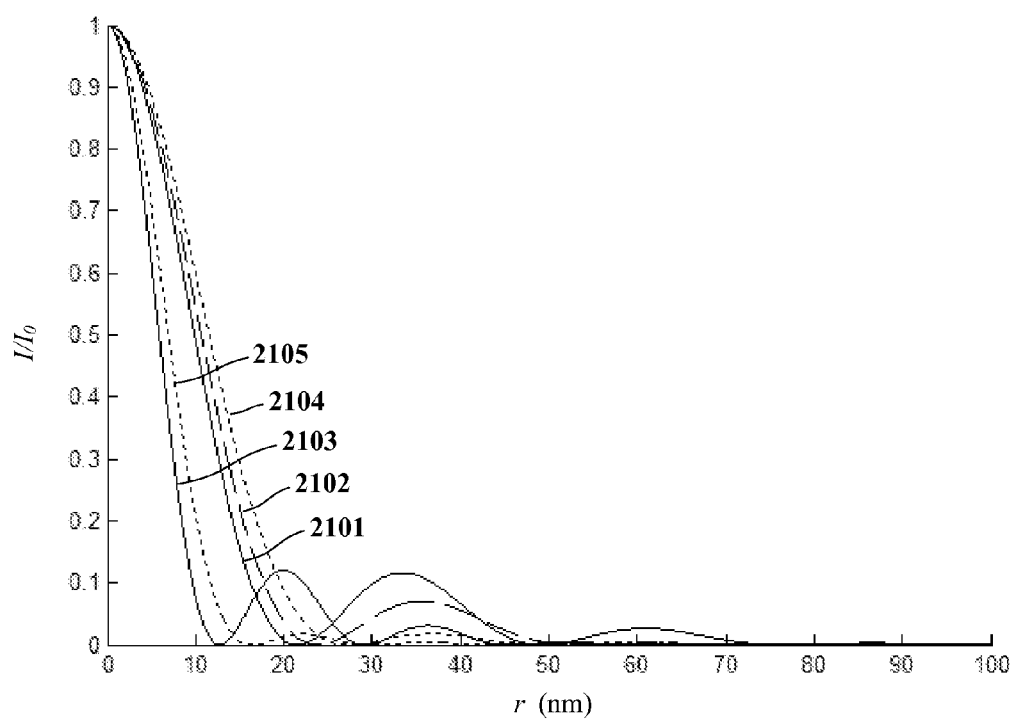
FIG. 21 illustrates image-plane, diffraction-limited point-spread functions for the three projection systems of FIGS. 17A-17C, in comparison to the point spread of an unobstructed system.

Achromatization can also be achieved by combining elements in the manner of a conventional air-spaced doublet (e.g., see FIGS. 20 and 21 on pp. 1.24 and 1.25 in Ref. 2). In particular, elements having similar dispersion characteristics can be combined in the manner of a "one-glass achromat." (See Ref 1, pp. 89-92.) One such lens form, a "Schupmann lens" is illustrated schematically in an EUV embodiment in FIG. 8A, alongside two singlet configurations that have equivalent optical power but are not achromatized (FIGS. 8B and 8C). The doublet in FIG. 8A comprises two refractive lens elements, a converging element 801 and a diverging element 802. The FIG. 8B system is a converging element 803, and the FIG. 8C system is a diverging element 804. All three systems are configured to channel a substantially collimated incident beam from a radius-R aperture into a point-divergent beam of numerical aperture NA.

For a particular design wavelength $\lambda_D$, element 801 converges a substantially collimated incident beam toward and through intermediate focal point 805. Element 802 receives a divergent beam from point 805 and further diverges it from virtual focal point 806. The foci 805 and 806 may be somewhat aberrated, by design, to compensate for the projection system's geometric aberration. The element-801 and element-802 optical designs can be simultaneously optimized to achieve exact aberration compensation at two distinct wavelengths.

The Schupmann design has a free parameter k, which controls the balance of optical power between elements 801 and 802 and their relative size. The ratio of the element-801 focal length to the distance d between elements 801 and 802 is $1-k$. Elements 801, 803 and 804 all have aperture radius R, and element 802 has aperture radius $(k/(1-k))\,R$. k is preferably not greater than $\tfrac{1}{2}$; otherwise element 802 will be larger than element 801 and optical efficiency will be compromised by fill factor losses. (As illustrated in FIG. 8A, $$k = \frac{1}{2}$$

and elements 801 and 802 have the same aperture radius R.)

Figure 8A:
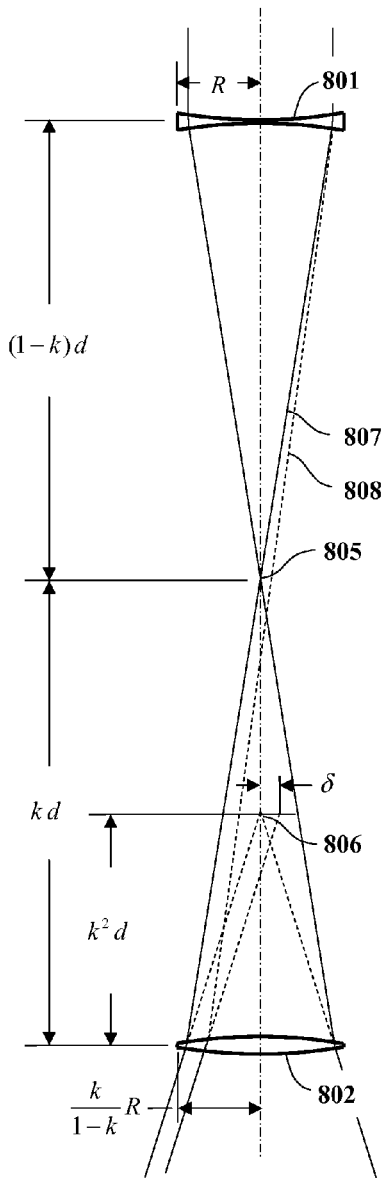
FIGS. 8A-8C illustrate cross-sectional schematic views of an achromatic EUV microlens comprising a Schupmann refractive doublet, in comparison to two types of singlet EUV lenses.
Figure 8B:
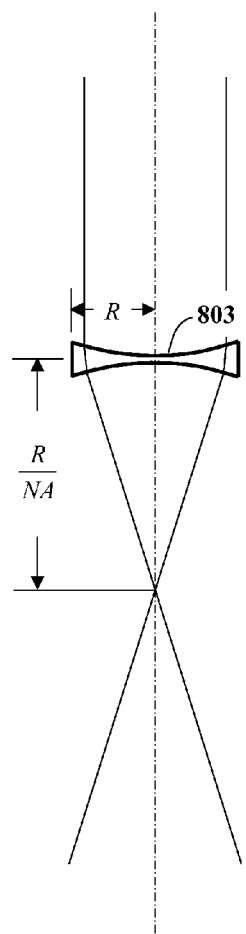
Figure 8C:
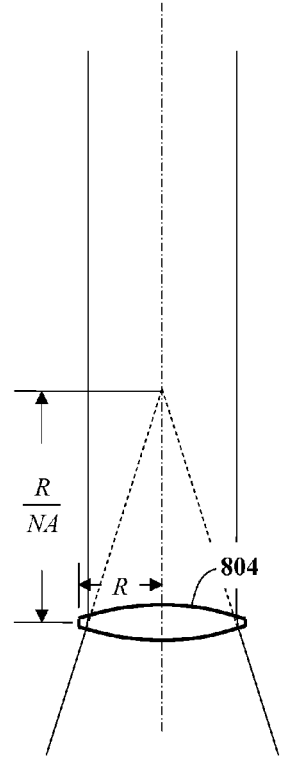

FIGS. 8A-8C represent the design ray-trace geometry for a particular design wavelength $\lambda_D$. Based on this geometry, the distance d is related to the numerical aperture NA by Eq. 8.1, and the thickness curvature $t''_0$ in Eq's. 2.2 and 2.3 has the values in Eq. 8.2 for elements 801, 802, 803 and 804, where $n_D$ is the real part of the lens refractive index at wavelength $\lambda_D$. Ray 807 in FIG. 8A represents an edge ray at the design wavelength $\lambda_D$. For another wavelength $\lambda$ (represented by edge ray 808), the transmitted wave curvature $c_t$ at element 802 has the functional form defined in Eq. 8.3, where $c_{t,D}$ is the design value $(-1/(k^2\,d))$. A Taylor-series approximation is applied to obtain the right-hand equality in Eq. 8.3 for $\lambda$ close to $\lambda_D$. The deviation $\delta$ between edge rays 807 and 808, projected back to virtual focal point 806, is given approximately by Eq. 8.4. For a 2% wavelength band at $\lambda_D=13.5$ nm, Eq. 8.4 can be numerically evaluated with the help of Eq. 2.1 to obtain Eq. 8.5.

The relative efficiencies of the lenses illustrated in FIGS. 8A-8C can be simply estimated under the assumption that the lens elements have zero minimum thickness (zero center thickness for meniscus elements and zero edge thickness for convex elements). For $n_D<1$ this implies that elements 801 and 802 both have maximum thickness $$-\frac{1}{2}k \cdot NA \cdot R/(n_D - 1),$$

and elements 803 and 804 both have maximum thickness $$-\frac{1}{2}NA \cdot R/(n_D - 1)$$

from Eq's. 2.2 and 8.2). There is no efficiency penalty for combining elements 801 and 802 in series because a ray traversing the thickest, most highly attenuating portion of either element will traverse the thinnest, least attenuating portion of the other element. The combined path length through elements 801 and 802 is uniform over the aperture and is smaller than the maximum path through either of the elements 803 or 804 by a factor of k. Hence the transmittance efficiency of the doublet can be estimated from an equation similar to Eq. 2.9 by including an extra factor of k in the exponent (Eq. 8.6). For example, $$k = \frac{1}{2}$$

and if elements 803 and 804 have minimum transmittance of 1% over their aperture, then a Schupmann doublet with the same aperture radius and numerical aperture will have uniform transmittance of 10%.

Figure 9:
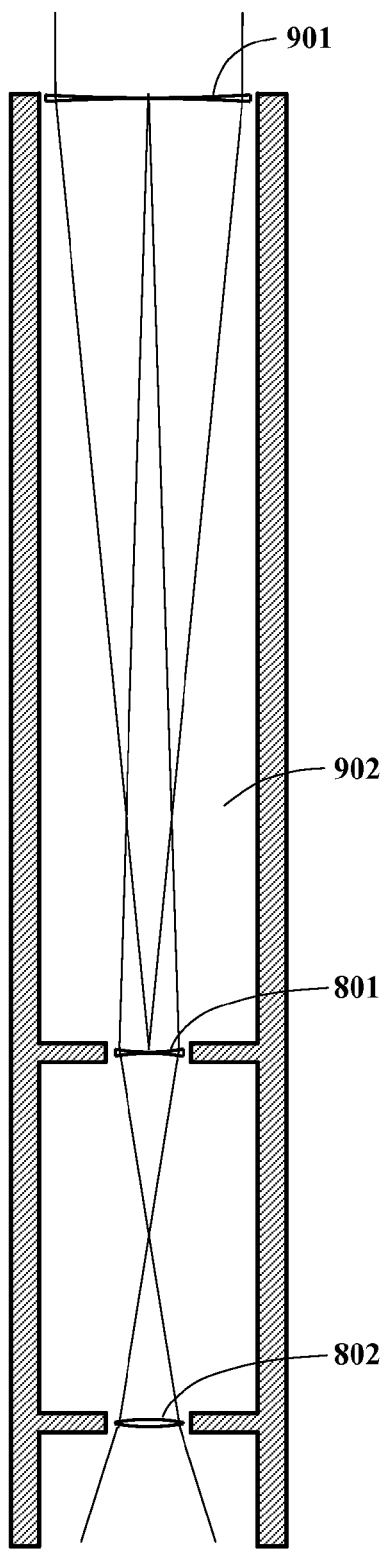
FIG. 9 illustrates an EUV Schupmann refractive doublet preceded by a low-power condenser lens in a microchannel housing.

The Schupmann lens of FIG. 8A thus has three advantages over either of the singlet forms in FIGS. 8B and 8C: (1) greatly reduced chromatic dispersion, (2) higher minimum transmittance, and (3) uniform transmittance. According to the above-outlined geometric-optics model the transmittance loss can be made arbitrarily small by choosing a sufficiently small k value. This reduces the optical loss in both elements by making element 801 very low-power and making element 802 very small. The limitation to this approach is that the factor (1−k)/k on the right side of Eq. 8.3 becomes very large. Furthermore, the diffractive point spread at focus 805 in FIG. 8A can become very large, approaching the size of element 802, when k is small. An alternative achromatization method that circumvents this limitation is to use a Schupmann doublet with very small lens elements of comparable size, preceded by a long-focal-length lens to condense the beam down to the requisite aperture size. For example, FIG. 9 illustrates a Schupmann lens comprising elements 801 and 802 preceded by a low-NA condenser lens 901, which focuses radiation through a microchannel 902 and onto a diffraction-limited spot overfilling the aperture of element 801. In a practical embodiment, elements 801 and 802 could have aperture radii of 1 μm, and lens 901 could have aperture radius 10 μm and numerical aperture 0.003, implying a 3.3-mm microchannel depth between elements 901 and 801. In this embodiment element 901 would have an apodized transmittance profile with an edge transmittance of 31% (Eq. 2.9). Element 901 is not achromatized, but according to Eq. 2.5 the maximum chromatic deviation δ g in its focal plane (the aperture plane of element 801) would be 0.3 μm, which is significantly less than the diffraction limit (λ/NA=(0.0135 μm)/0.003=4.5 μm).

Figure 10:
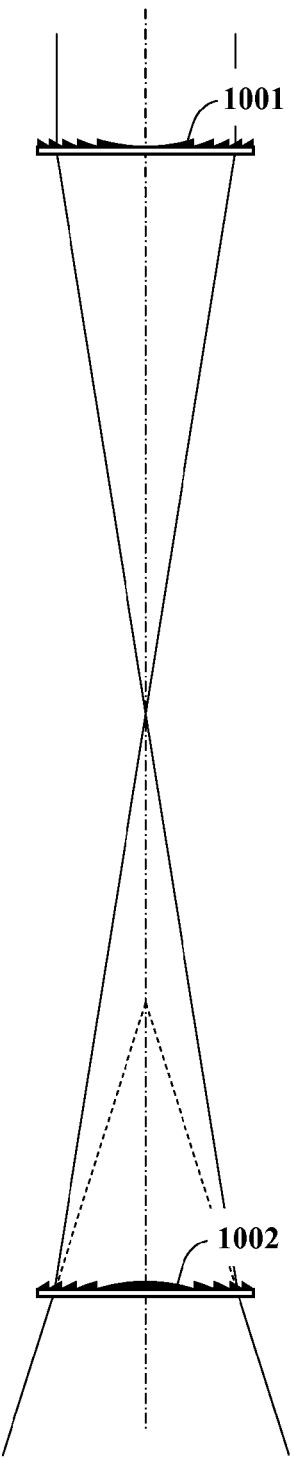
FIG. 10 illustrates an achromatic, EUV Schupmann doublet comprising two diffractive lens elements (phase-Fresnel lenses, as illustrated)

The efficiency limitation of the Schupmann lens can be circumvented by replacing elements 801 and 802 with diffractive lens elements 1001 and 1002, preferably phase-Fresnel or multi-level blazed elements, as illustrated in FIG. 10. (For EUV applications the Fresnel zones of element 1001 are concave and those of element 1002 are convex. The same type of system would be applicable to DUV, in which case element 1001 would comprise convex Fresnel zones and element 1002 would comprise concave Fresnel zones.) The derivation of Eq's. 8.1-5 can be repeated, using Eq. 3.2 instead of Eq. 2.3, to obtain Eq's. 10.1-4 for a diffractive Schupmann lens. (Eq. 8.1 applies equally well to a diffractive lens.) Note that the substitution of diffractive elements reduces the residual chromatic dispersion by an additional factor of eight; cf. Eq's. 8.5 and 10.4. If phase-Fresnel elements 1001 and 1002 are used the maximum transmission efficiency of each element will be approximately 60% (FIG. 6), for a combined efficiency of 36%. Assuming, for example, an aperture radius of 10 μm and numerical aperture of 0.015 for each lens (for a combined NA of 0.03), the elements 1001 and 1002 in FIG. 10 each has approximately six grating periods. The outer zone width is 900 nm, and the Fresnel facet height is 177 nm. The separation distance between elements 1001 and 1002 is approximately 1.3 mm.

Figure 11:
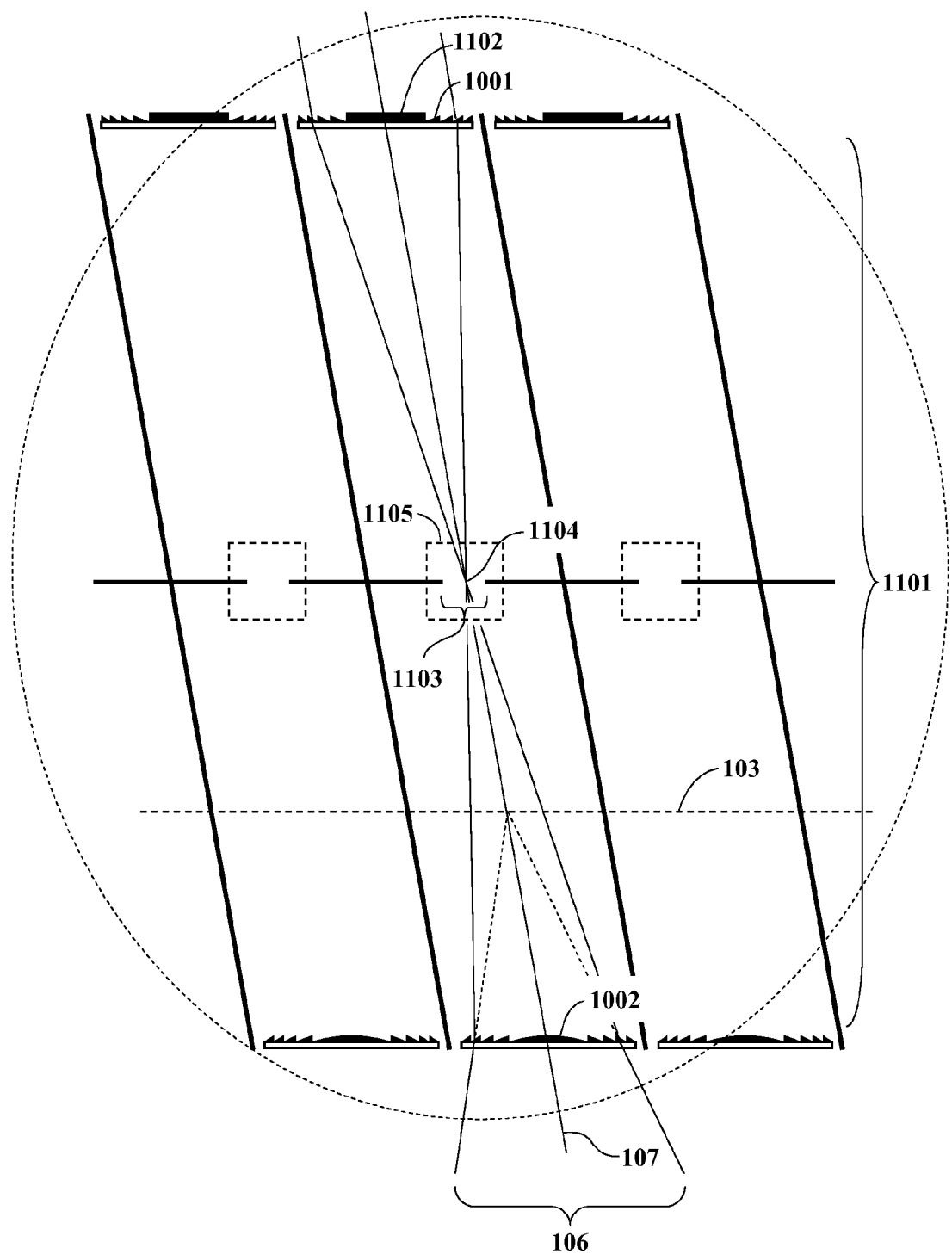
FIG. 11 is an expanded view of region 11 in FIG. 1A, illustrating spot-generating optics comprising EUV Schupmann diffractive doublet lenses with the spots' chief rays oblique to the object surface.

Transmitting EUV microlenses can be used in a system such as that of FIG. 1A in which the chief ray 107 is not orthogonal to the object surface 103. For example, FIG. 11 shows an expanded schematic view of region 11 in FIG. 1A, in an embodiment using phase-Fresnel Schupmann lenses. An array of microlens pairs, such as the elements 1001 and 1002 described above, is supported by a microchannel array 1101, which passes radiation between the paired elements. Lens elements 1001 and 1002 direct radiation into a divergent light cone 106 with chief ray 107 oblique to object surface 103. The microlenses have central obscurations, such as obscuration 1102, to control stray light at the image surface. Also, stray light can be controlled by means of aperture filters near the lens foci, such as aperture 1103 near intermediate focus 1104. (The aperture should be underfilled to accommodate geometric and chromatic aberration compensation.)

Some embodiments may also be equipped with modulators such MEMS-actuated microshutters at the foci (indicated schematically by box 1105 in FIG. 11) to provide individual modulation of each object spot. For example, U.S. Pat. No. 6,214,633 discloses an optical modulator array comprising MEMS-actuated shutters positioned on a non-transparent surface between converging microlens arrays. (The '633 patent does not anticipate the combination of converging and diverging microlenses in the achromatic configuration of FIG. 11.) In a variation of this approach, the microshutters may be formed on transparent, textured surfaces (e.g., transmission diffraction gratings), which deflect shuttered light out of the system via forward scattering or diffraction. U.S. patent application Ser. No. 13/198,512 discloses an alternative "Stacked-Grating Light Modulator," which could also be used as element 1105 in FIG. 11 (particularly for DUV applications).

The lens designs outlined above are based on simplifying paraxial optics approximations and apply to point-focus lenses, but the same principles can be applied to exact lens design with aberration compensation, using known prior-art optical design methodologies and commercial design software such as Zemax and CODE V. In general, two lens surfaces—either refractive or diffractive—of an achromatic doublet such as that of FIG. 7, FIG. 8A or FIG. 10 provide sufficient degrees of freedom to achieve perfect geometric point imaging at the printing surface 104 (FIG. 1A) at two distinct design wavelengths, compensating for both chromatic aberration in the lens elements and geometric optical aberration in the projection optics.

EUV Micromirrors

As noted in the '843 application, the term "microlens" can generally denote a refractive and/or reflective micro-optic focusing device. Micromirrors have potential advantages over refractive microlenses for EUV application (and possibly also for DUV). Using conventional EUV-reflective mirror coatings, strong focusing can be achieved with a very shallow, curved mirror surface, with high and spatially uniform reflection efficiency, and without any chromatic aberration.

Figure 12:
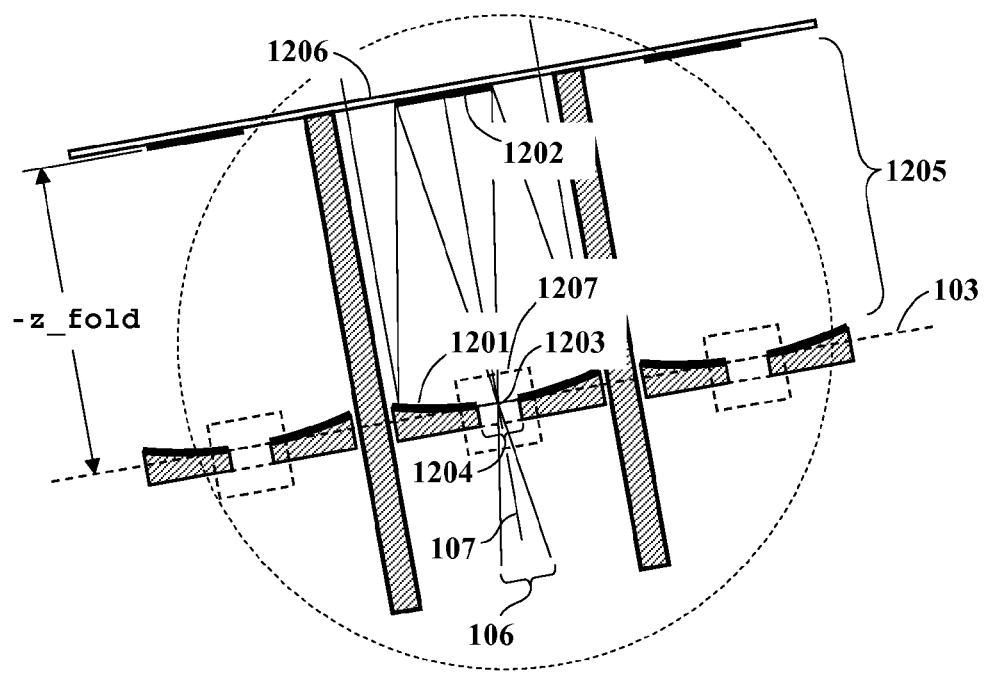
FIG. 12 is an expanded view of region 12 in FIG. 1B, illustrating alternative spot-generation optics comprising micromirrors.

A micromirror structure that would be suitable for the FIG. 1B projection system is illustrated schematically in FIG. 12. This is an expanded schematic view of region 12 in FIG. 1B. The figure is tilted to indicate the object surface curvature. EUV radiation is directed onto approximately paraboloidal micromirrors such as element 1201, which converges the radiation toward flat folding mirror 1202 and brings it to a focus at point 1203 on the object surface 103. In this embodiment mirror element 1201 is proximate surface 103. An underfilled, open aperture 1204 at the center of mirror 1201 transmits the focused beam into divergent light cone 106 centered on chief ray 107, which is orthogonal to object surface 103. (This configuration was termed "Cassegranian-type" in the summary, although it is technically a folded Newtonian system because element 1202 is preferably not curved.) The mirrors are supported by a microchannel array 1205, which passes radiation between the paired mirrors. Element 1202 may be supported by a thin, EUV-transmitting silicon layer 1206, or by a spider-vane structure. Aperture 1204 operates to block stray light, and some embodiments may be equipped with modulators such as MEMS-actuated microshutters at the foci (indicated schematically by box 1207) to provide individual modulation of each object spot.

Figure 13:
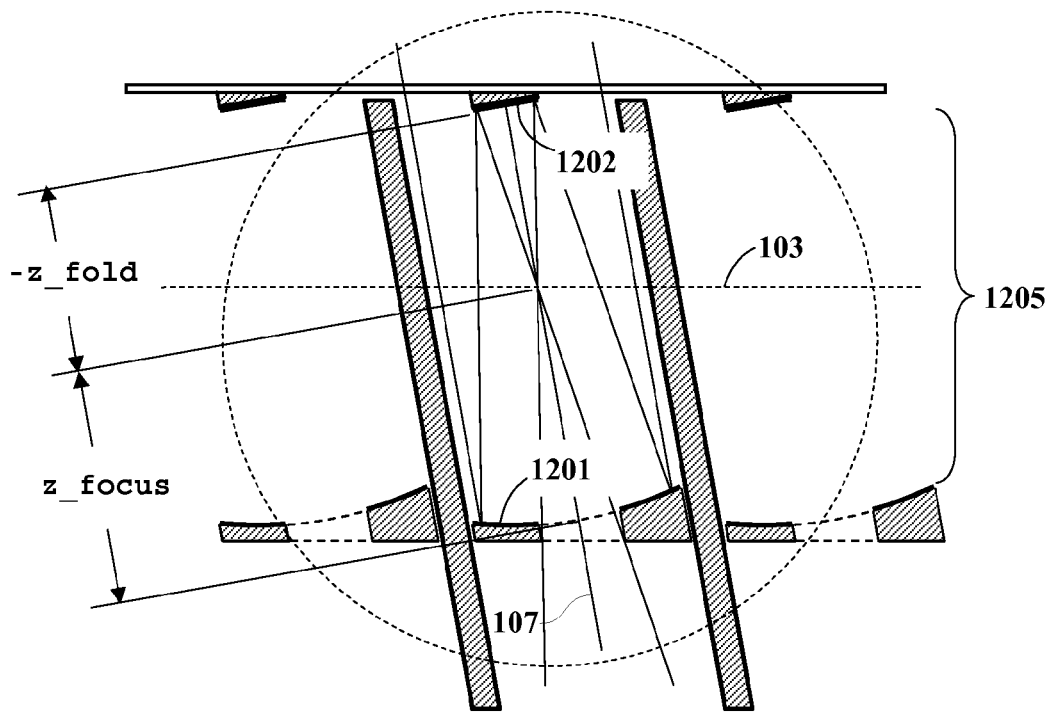
FIG. 13 is an expanded view of region 13 in FIG. 1A (the same as region 11, but in a different embodiment), illustrating spot-generation optics comprising micromirrors with the spots' chief rays oblique to the object surface.

Micromirrors could similarly be used in the FIG. 1A system, in which the chief ray 107 is oblique to the object surface 103. An expanded view of region 13 in FIG. 1A is shown in FIG. 13, illustrating this type of configuration. (This is the same as region 11, represented by FIG. 11, but in a different embodiment.) In this embodiment, the mirror surfaces would have to be tilted relative to object surface 103 to achieve beam clearance constraints. Also, the central obscuration in FIG. 1A is smaller than in FIG. 1B (because mirror M1 is closer to image plane 104), and consequently the object surface 103 is located near the center of the microchannel array to avoid enlarging the obscuration. Due to these complications, a transmitting microlens system such as that of FIG. 11 may be more practical for the FIG. 1A system.

Figure 14A:
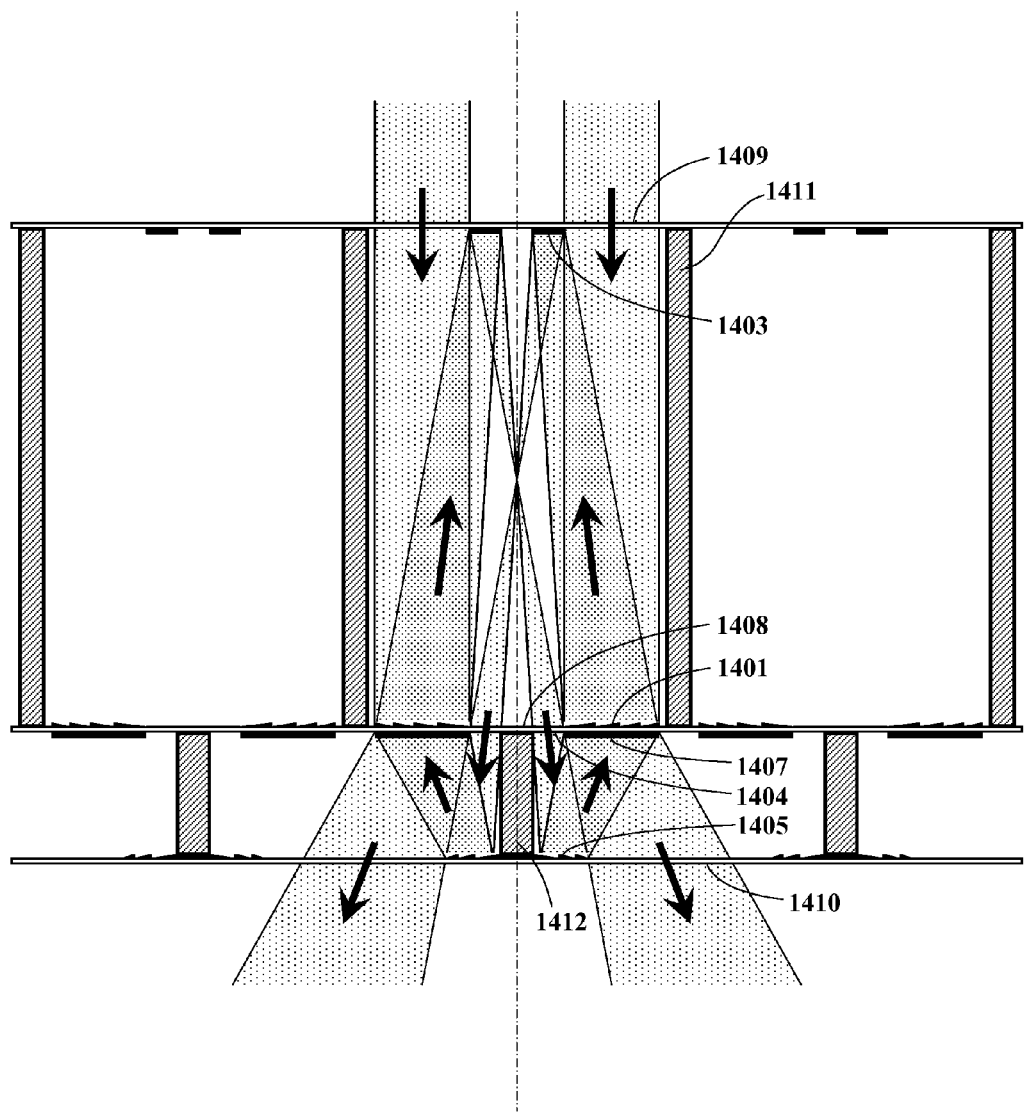
FIGS. 14A and 14B illustrate an achromatic, EUV Schupmann diffractive doublet comprising two reflective phase-Fresnel mirrors and two flat folding mirrors.
Figure 14B:
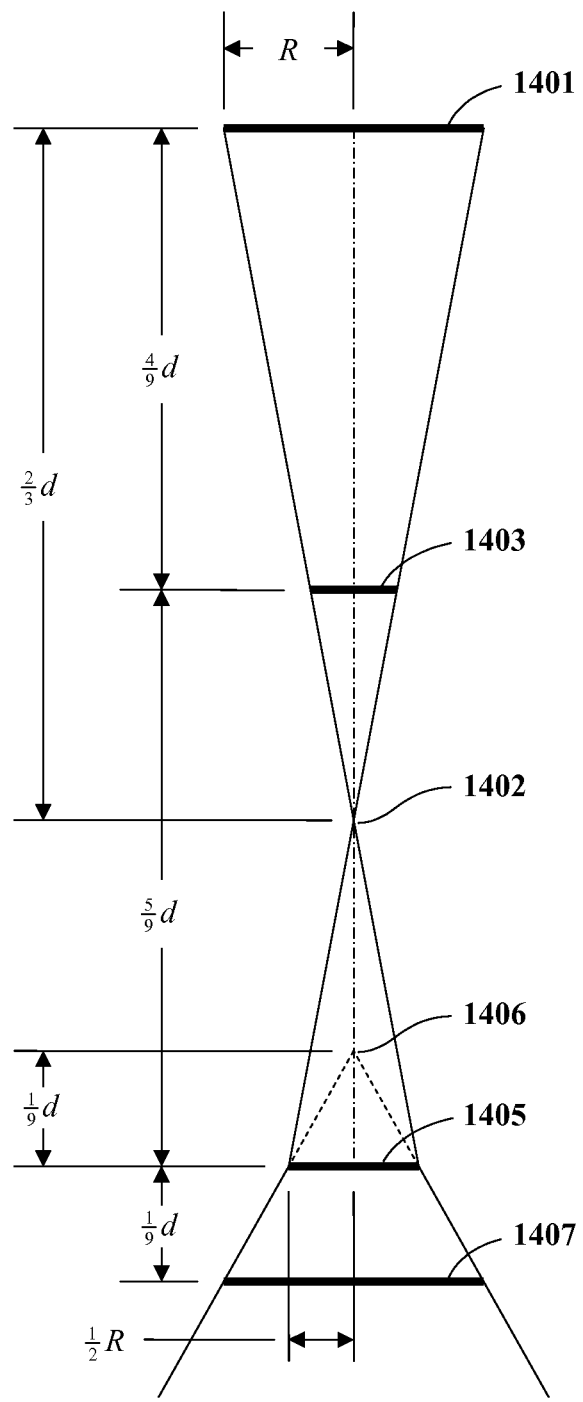

As an alternative to the FIG. 12 structure, the Schupmann lens design illustrated in FIG. 10 can be converted into a diffractive micromirror design by folding the optical layout, as illustrated in cross-section in FIG. 14A. FIG. 14B schematically illustrates the unfolded system, which is similar to FIG. 8A with $$k = \frac{1}{3}.$$

(Elements 1401 and 1405 in FIGS. 14A and 14B perform the same function as respective elements 801 and 802 in FIG. 8A.) Substantially collimated EUV radiation is converged by diffractive micromirror 1401 toward focal point 1402 (FIG. 14B). Flat folding mirror 1403 redirects the radiation through EUV-transparent annular aperture 1404 in element 1401 (FIG. 14A). A diffractive mirror 1405 further diverges the radiation from virtual focus 1406 (FIG. 14B) and directs it toward a flat folding mirror 1407 on the back side of element 1401 (FIG. 14A).

Element 1401 has aperture radius R and element 1405 has aperture radius $$\frac{1}{2}R.$$

The unfolded distance between the two diffractive elements 1401 and 1405 is d, the unfolded distance from element 1401 to focus 1402 is $$\frac{2}{3}d,$$

and the distance from element 1405 to virtual focus 1406 is $$\frac{1}{9}d.$$

The distance between elements 1401 and 1403 is $$\frac{4}{9}d,$$

and the distance between elements 1405 and 1407 is $$\frac{1}{9}d.$$

These are approximate dimensional specifications, which are chosen to achieve beam clearances with minimal obscuration or fill factor loss.

The diffractive micromirrors 1401 and 1405 preferably comprise phase-Fresnel or multi-level blazed grating structures. Micromirrors 1401 and 1407 are supported on either side of a thin, EUV-transparent silicon layer 1408 (FIG. 14A), and coated with EUV-reflective multilayer coatings. Mirror 1403 is supported by a thin, EUV-transparent silicon layer 1409 (or alternatively, spider vanes), which allows passage of radiation from the EUV source. Mirror 1405 is similarly supported by a thin, EUV-transparent silicon layer 1410. Layers 1408 and 1409 are supported by a microchannel array 1411, and layer 1410 is anchored to layer 1408 by means of posts such as post 1412 in the obscured portion of the optical path.

Figure 15:
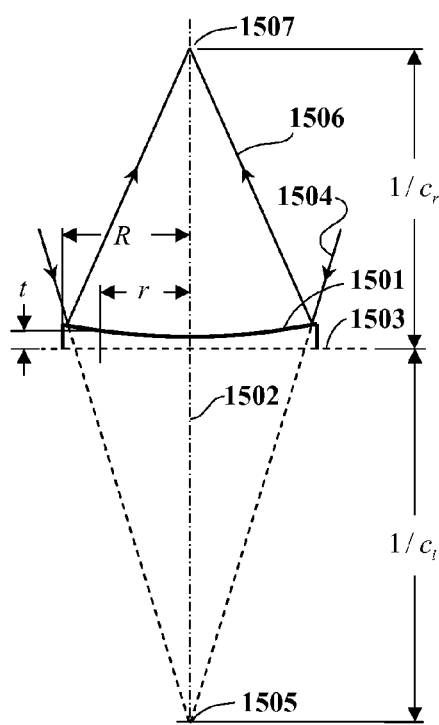
FIG. 15 illustrates a non-diffractive EUV micromirror in cross-section.
Figure 16:
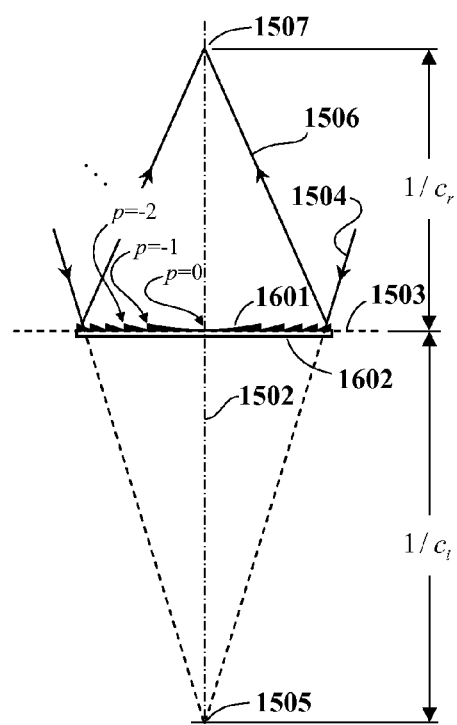
FIG. 16 illustrates a diffractive EUV micromirror in cross-section.

The paraxial focusing characteristics of non-diffractive micromirrors are outlined in Eq's. 15.1 and 15.2, and are illustrated in FIG. 15; and the corresponding characteristics of diffractive micromirrors are outlined in Eq's. 16.1 and 16.2 and illustrated in FIG. 16. FIG. 15 is a cross-sectional schematic view of a shallow mirror profile 1501 of aperture radius R, which is approximately axially symmetric about axis 1502. (Aberration-correcting micromirrors would be somewhat asymmetric.) For EUV applications the surface would have a multilayer EUV-reflecting coating (e.g., comprising molybdenum/silicon bilayers), not shown. The surface shape is characterized by a thickness profile t relative to a flat reference plane 1503. The thickness t has an approximately quadratic dependence on radial position r, as described by Eq. 2.2. (Plane 1503 is below the mirror in FIG. 15. If it is above the mirror then t is negative and represents the mirror sag.) A spherical-wave incident beam with wave curvature $c_i$, represented by edge ray 1504 in FIG. 15, is convergent toward point 1505. The beam is reflected into an approximately spherical-wave beam of wave curvature $c_r$, represented by edge ray 1506, which converges toward point 1507. Eq. 15.1 defines $c_r$ as a function of $c_i$ and $t''_0$ in a paraxial approximation. (The curvatures $t''_0$, $c_i$ and $c_r$ are signed quantities, and are all positive as illustrated in FIG. 15.) Comparing Eq. 15.1 with Eq. 2.3, a micromirror can be modeled as a thin transmitting lens with n=−1 and $c_t=c_r$.

A shallow micromirror can be modeled as an infinitesimally thin phase-shifting and attenuating layer on a flat reflective surface at plane 1503. Its complex reflectance ρ is given by Eq. 15.2, where t is the physical thickness profile as defined above. The reflectance factor is applied to the incident electric field amplitude $E_i$ at the layer to obtain the reflected field amplitude $E_r$. Eq. 15.2 has the same form as a thin transmitting lens's transmittance τ factor (Eq. 2.6) with the substitutions n=−1, k=0. As defined by Eq. 15.2, ρ does not include the reflectance of the mirror surface or coating. It only represents the topography-related phase shift relative to a flat mirror in plane 1503.

FIG. 16 is a cross-sectional view of a diffractive micromirror 1601 on a flat substrate 1602 (such as a thin silicon layer), which is similar to the diffractive lenses of FIGS. 3A and 3B but operating in reflection mode. The grating profile is illustrated as a phase-Fresnel mirror, but any alternative mirror structure such as a zone plate or multi-level blazed grating may be used. For EUV applications, the profile shape can be patterned in the substrate surface prior to deposition of a multilayer EUV-reflective coating. Alternatively, the coating can be deposited on an unpatterned, flat substrate and the grating can be formed by either etching into the coating or depositing and patterning an EUV-transparent, phase-shifting layer on top of the reflection coating. The latter approach is similar to that used for EUV phase-shift masks, e.g., as described in Ref 4 and Ref 6. Substrate patterning would result in very shallow profile topographies (e.g. 6.75-nm depth for a phase-Fresnel grating and design wavelength of 13.5 nm), whereas the latter approaches would require grating depths of order 100 nm or greater.

A reflection grating is characterized by its phase distribution p, similar to that of a transmission grating, which increases in the direction of the first diffracted order relative to the zero order. The grating phase has an approximately quadratic dependence on radius r, as described by Eq. 3.1. As in FIG. 15, the grating structure of FIG. 16 reflects a curvature-$c_i$, spherical-wave incident beam into a curvature-$c_r$, $c_r$ reflected beam. $c_r$ is defined by Eq. 16.1. (As illustrated in FIG. 16, the curvatures $c_i$, $c_r$ are positive, $p''_0$ is negative, and the grating operates as a converging element.) Eq. 16.1 is equivalent to Eq. 3.2 with $c_t=c_r$.

A diffractive mirror is characterized by a thickness profile t relative to reference plane 1503, which can have any of the forms illustrated in FIG. 5. A shallow grating can be characterized by a reflectance factor ρ, as defined by Eq. 16.2. This equation, and other equations derived from Eq. 16.2, are applicable to an EUV reflection grating comprising a multilayer reflection coating deposited uniformly on a patterned substrate.

A reflection grating's reflection coefficient ρ can be decomposed into a Fourier series with coefficients $\Sigma_m$ (Eq. 16.2) in a manner analogous to a transmission grating (cf. Eq. 5.4). The substitutions $n_D=n=-1$, k=0, τ=ρ, $\tau_m=\rho_m$, $c_t=c_r$ and $c_{tD}=c_{rD}$ can be applied to adapt the equations for transmission lenses in FIGS. 4A-4D to work for reflection lenses. Adapted Eq's 5.7, 5.9 and 5.11 correspond to the respective grating profiles 501, 502 and 503 illustrated in FIG. 5, with the height reference $\lambda_D/|n_D-1|$ in FIG. 5 equal to $\lambda_D/2$ for reflection gratings. Reflection efficiencies $|\rho_m|^2$ obtained from these modified equations are tabulated in FIG. 6 along with the transmission grating efficiencies.

FIG. 6 demonstrates the principal advantages of reflection gratings over transmission gratings for EUV application: The surface topography height h is reduced by more than an order of magnitude; the first-order efficiency of a phase-Fresnel mirror is 100% (relative to an unpatterned EUV mirror), and extraneous diffraction orders are substantially eliminated. A rigorous electromagnetic simulation of the grating structure would show that there is some optical scatter into extraneous orders, but for long-period gratings the FIG. 6 data can be expected to be fairly accurate. (For the L-level blazed structure, Eq. 5.11 predicts non-zero diffraction efficiencies $|\rho_m|^2$ at the blaze wavelength for orders 1+j L for integers j. For example, the efficiencies of an 8-level structure in orders −7 and 9 would be 1.9% and 1.2%, respectively.)

Illustrative Design Data (With Micromirrors)

Figure 17A:
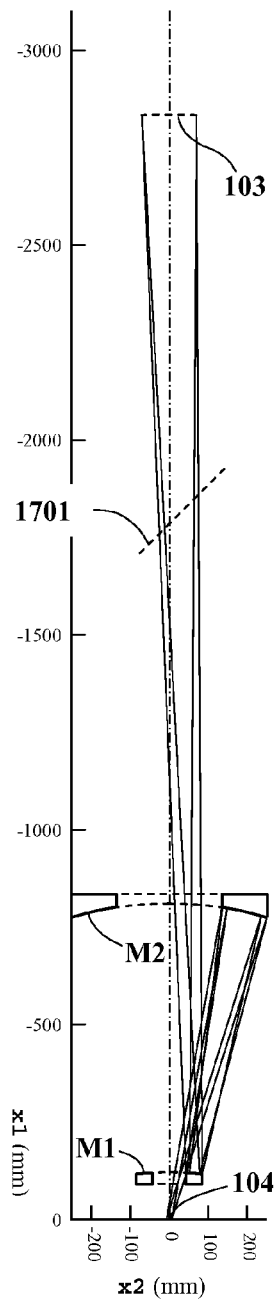
FIGS. 17A-17C are dimensioned illustrations of several embodiments of the Schwarzschild projection system illustrated schematically in FIGS. 1A and 1B.
Figure 17B:
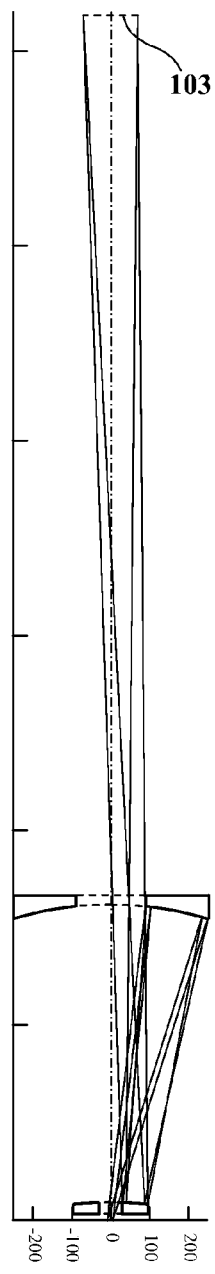
Figure 17C:
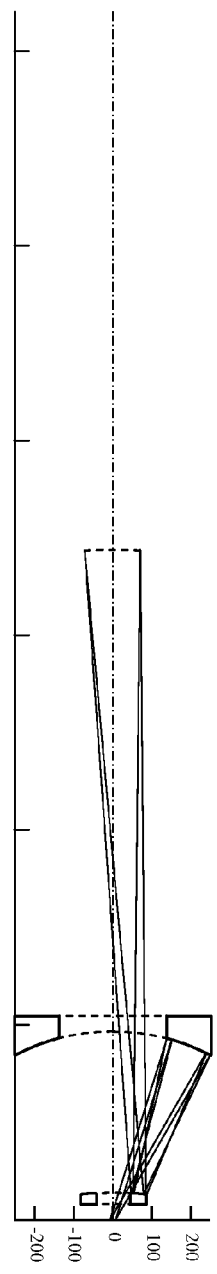

FIGS. 17A-17C illustrate three specific embodiments of the projection systems of FIGS. 1A and 1B. FIG. 17A is a 0.3-NA system with a shape-constrained object surface M2 (FIG. 1B). FIG. 17B is a 0.3-NA system with an unconstrained object surface (FIG. 1A). FIG. 17C is a 0.5-NA system with a shape-constrained object surface (FIG. 1B). The and x2 coordinate scales are marked in millimeters. The optical paths are very long (e.g. 3 meters in FIG. 17B), but can be folded with flat mirrors (either multilayer or grazing-incidence) to make the system more compact. For example, a fold mirror could be inserted at position 1701 in FIG. 17A. (Alternatively, the entire projection system can be scaled down to a more practical size.)

Design data for FIGS. 17A-17C are tabulated in FIG. 18. Items marked with an asterisk a pre-specified; all others are calculated. Some of these parameters are illustrated in FIG. 1A: ap0, ap1, ap2 and ap3 are the aperture radii of the object, element M1, element M2, and the image, respectively. The "x1c" parameters in the "Obj.," "M1," and "M2" categories are the axial intercept coordinates of the object surface 103 and mirrors M1 and M2, respectively. (The annular mirror surfaces do not physically intercept the optical axis 108, but each surface-defining function is mathematically defined within the annulus.) The image surface 104 is at x1=0.

The NA in FIG. 18 is the numerical aperture at the image. NA_inner is the numerical aperture limit defined by the inner obscuration. FIGS. 17A-17C illustrate limit rays at the image boundaries, at both the inner and outer numerical aperture limits. In FIGS. 17A and 17C (corresponding to FIG. 1B) the inner NA limit is defined by M1 because the object shape constraint causes the optimum M1 position to move further from the image plane. In FIG. 17B (corresponding to FIG. 1A) the object shape is unconstrained and M1 is much closer to the image. In this case the inner numerical aperture limit is defined by M2.

The "demag" parameter in FIG. 18 is the object-to-image demagnification, which is 10× for all three designs. Thus, the object aperture radius (ap0) is ten times the image radius (ap3). Also, the numerical aperture at the object is NA/10 (i.e. 0.03 for FIGS. 17A and 17B, 0.05 for FIG. 17C). The image field is circular with a radius (ap3) of $5\sqrt{2}$ mm, which is sufficient to cover a 10-mm square image area.

The M2 aperture radius (apt) is fixed at 250 mm for all three designs. This specification, in combination with the image NA specification, determines the coordinate position of the M2 aperture edge.

The mirrors M1 and M2 and object surface 103 have axial symmetry about a common axis 108 (FIG. 1A), and are defined in terms of x1, x2, x3 coordinates, where the axis coincides with the optical axis, and is zero at the image plane and negative at the object (cf. FIG. 17A). Each surface is described by a standard aspheric equation, Eq. 18.1, where $x1c$ is the x1 coordinate at the surface's axial intercept, c is the surface's spherical curvature, and $a_4 \ldots a_{10}$ are aspheric coefficients. (Coefficients that are unspecified in FIG. 18 are zero.)

Figure 19A:
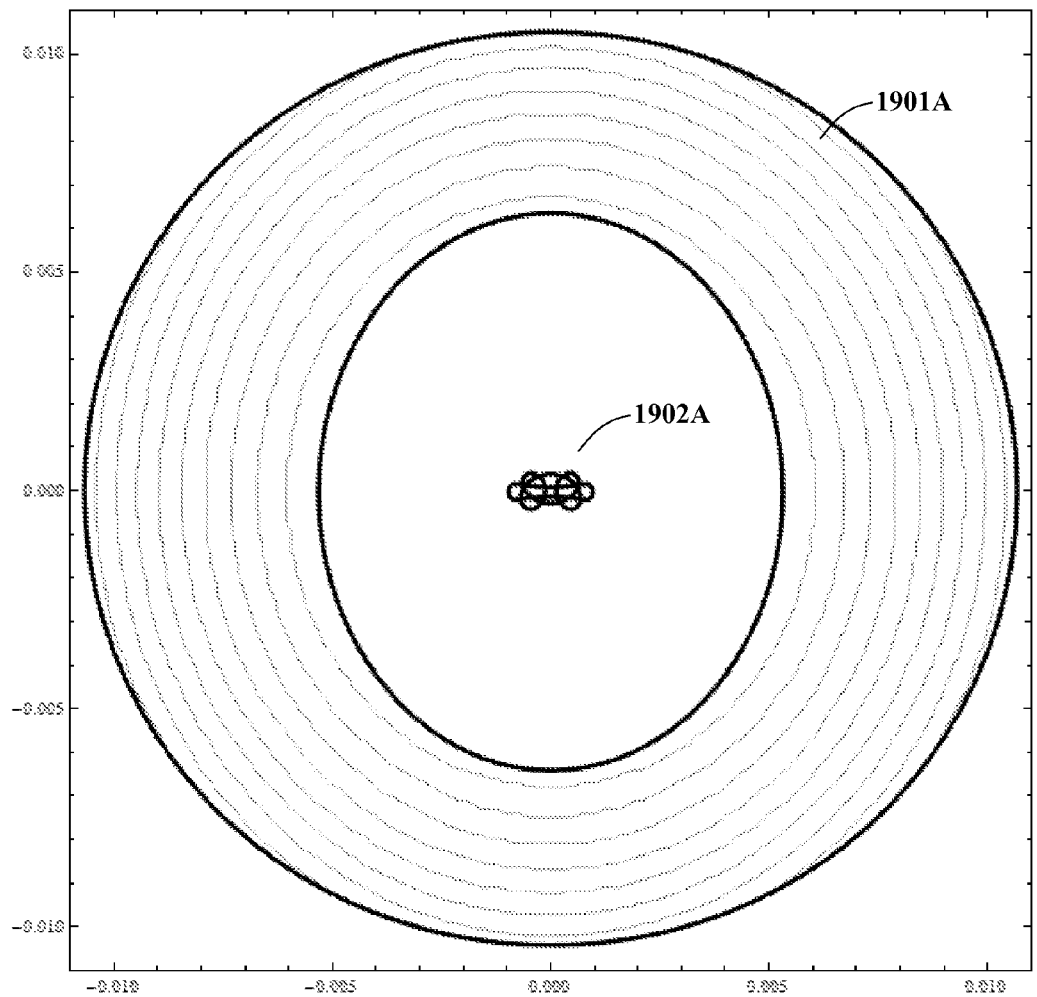
FIGS. 19A-19C and 20A-20C illustrate beam aperture limits and surface height contours on the micromirror surfaces of FIGS. 12 and 13 at the edge of the object field in the context of the projection systems of FIGS. 17A-17C.
Figure 19B:
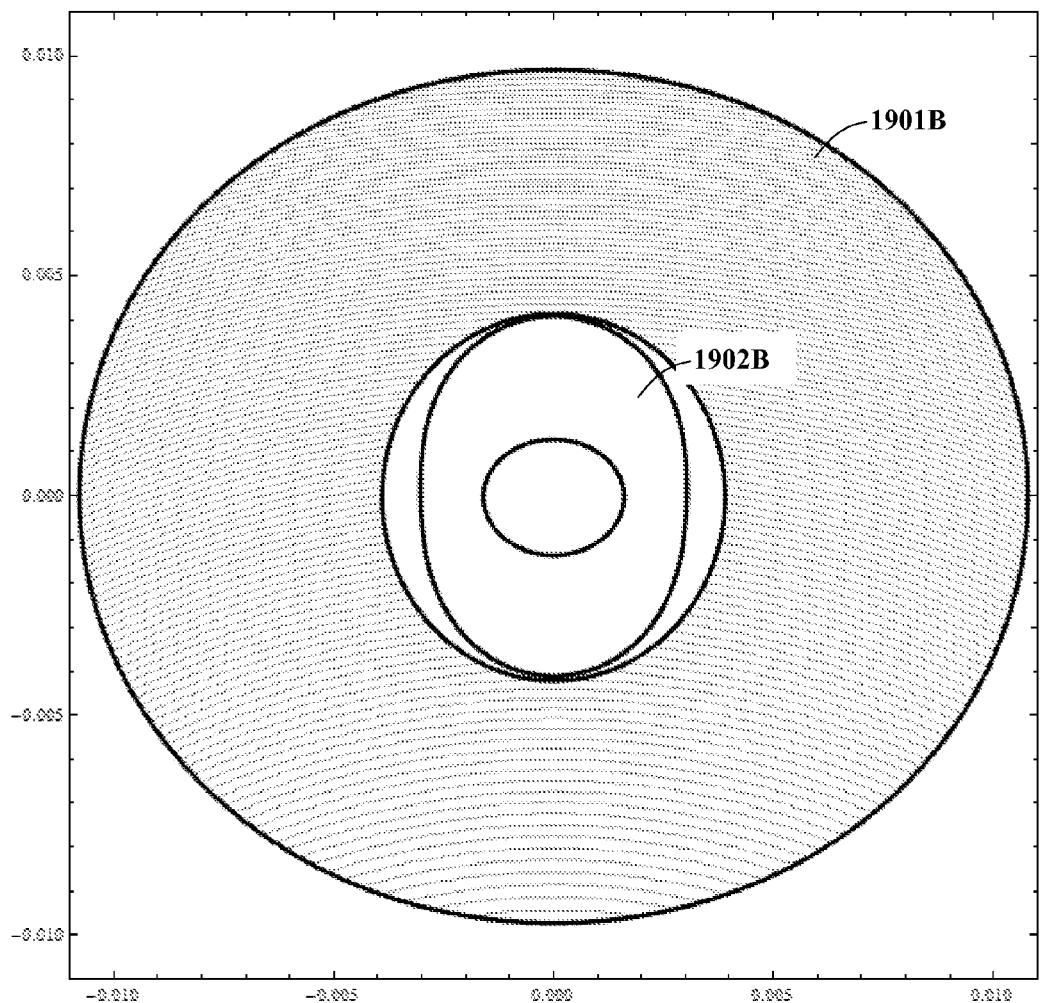
Figure 19C:
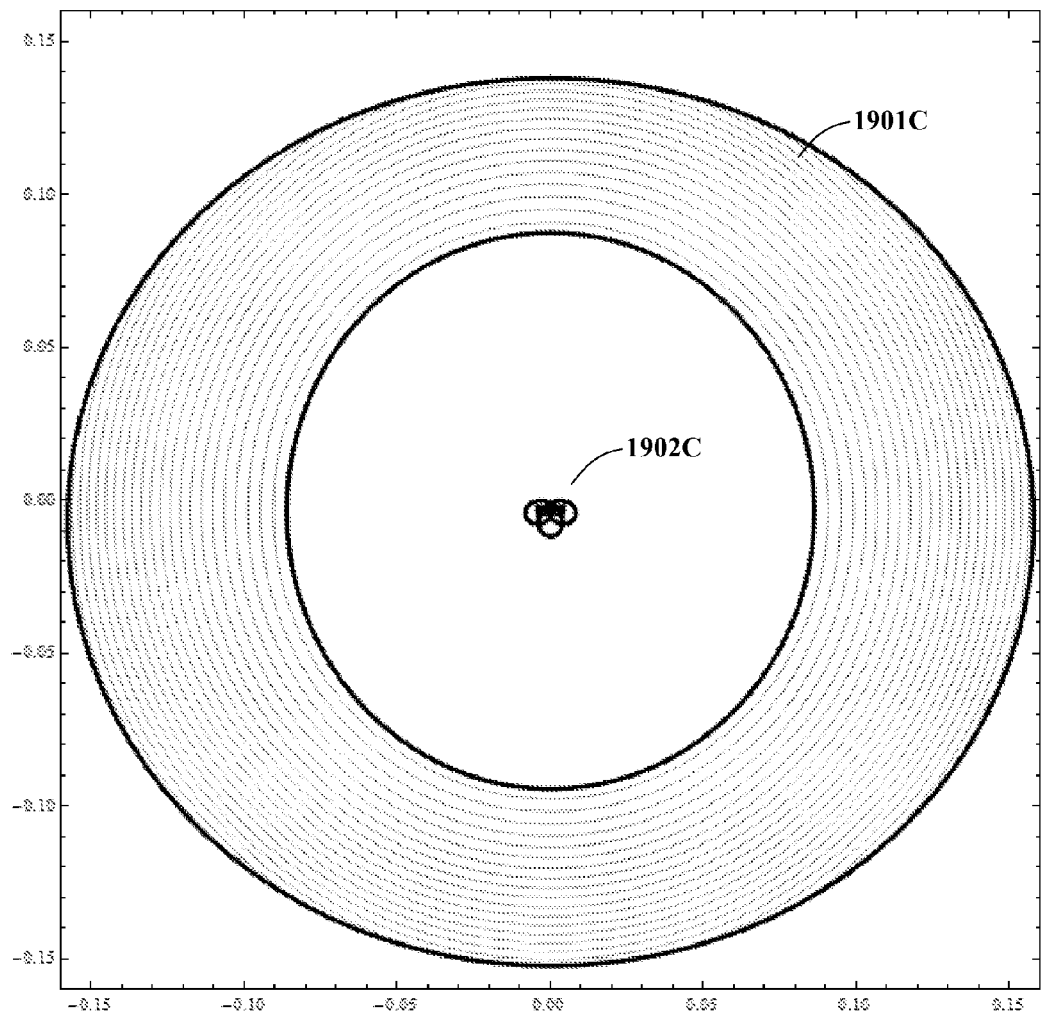

The FIGS. 17A and 17C systems could use micromirrors for object spot generation, as illustrated schematically in FIG. 12, and the FIG. 17B system could use the micromirror configuration illustrated in FIG. 13. (Transmission microlenses such as those illustrated in FIG. 11 could alternatively be used.) Plan views of the focusing micromirrors 1201 of FIGS. 12 and 13, projected onto object surface 103, are illustrated in FIGS. 19A, 19B, and 19C, for the FIGS. 17A, 17B and 17C systems, respectively. Similar plan views of the folding micromirrors 1202 are illustrated in corresponding FIGS. 20A, 20B and 20C. These figures illustrate the microlens geometry at the edge of the object field, where optical aberrations are most severe. The scales in FIGS. 19A-20C are demarked in millimeter units. The offset from object surface 103 to focus mirrors 1202 is indicated as z_focus in FIG. 18, and the offset to fold mirrors 1202 is indicated as z_fold; cf. FIGS. 12 and 13. (Following the coordinate sign convention illustrated in FIGS. 17A-17C, the upward direction in FIGS. 12 and 13 is negative and z_fold is hence negative.)

In FIG. 19A, annular aperture 1901A represents the clear aperture on mirror 1201 for reflection, as defined by the numerical aperture limits NA and NA_inner in FIG. 18. The outer aperture diameter is approximately 22 μm (implying an image-plane spot period of order 2.2 μm or greater). Surface height contours are plotted in aperture 1901A at 6.75 nm height intervals. The contours can be interpreted as mirror-induced phase shifts in multiples of $2\pi$ radians at a 13.5-nm operating wavelength. The full surface height variation over annular aperture 1901A is 65 nm.

The surface contours are non-circular because the mirror is configured to compensate for geometric aberration in the projection system. The surface shape represented by the contours in FIG. 19A (and similarly in FIGS. 19B and 19C) is defined by a simple phase-matching condition similar to that described in Eq. 35.1 of FIG. 35 in the '843 application. Since the surface intercepts radiation directed to only a single geometric image point, it can be configured to entirely eliminate optical aberration at the target image point.

The transmission aperture limits at mirror surface 1201 (i.e., in transmission aperture 1204 after reflection from mirror 1202, cf. FIG. 12) are illustrated as 1902A in FIG. 19A. This represents a reverse ray trace of rays projected from a particular conjugate image point, at the numerical aperture limits, back to the object surface. If the projection system had no geometric aberrations the aperture limits 1902A would reduce to a point on object surface 103. The aberrated spot 1902A has dimensions of order 1 μm, indicating that the image-plane aberration would be of order 100 nm without aberration compensation.

FIG. 19B similarly illustrates the annular reflection aperture 1901B and transmission aperture 1902B at mirror surface 1201 in FIG. 13 for the FIG. 17B configuration. Surface height contours relative to object surface 103 are plotted in aperture 1901B at 6.75-nm intervals, as in FIG. 19A. The high contour density is indicative of the mirror surface tilt. In contrast to FIG. 19A, the transmission aperture 1902B in FIG. 19B substantially fills the 1901B inner aperture because the mirror 1201 is displaced from the object surface 103 in FIG. 13. This displacement is required to achieve beam clearances with the smaller NA_inner limit (0.12 for FIG. 17B, versus 0.17 for FIG. 17A; cf. FIG. 18).

FIG. 19C illustrates the annular reflection aperture 1901C and transmission aperture 1902C, as in FIG. 19A, for the FIG. 17C system. (Note the difference in plot scale.) Surface height contours are plotted in aperture 1901C at 67.5-nm intervals (not 6.75 nm as in FIG. 19A). The aberrated spot 1902C has dimensions of order 10 μm, indicating that the image-plane aberration would be of order 1 μm without aberration compensation. The reflection aperture is quite large, approximately 320 μm in diameter, resulting in an image-plane spot period of order 32 μm or greater. The coarse spot density would greatly limit printing throughput, but could make it more feasible to equip the system with MEMS-actuated microshutters to individually modulate the transmission spots 1902C. The mirror sag is very large—close to 1.5 μm—so a diffractive system such as that of FIG. 10 or FIG. 14A may be more practical for the 0.5-NA system.

FIG. 20A illustrates the transmission aperture 2001A and reflection aperture 2002A at folding mirror surface 1202 in FIG. 12, for the FIG. 17A system, as defined by the NA and NA_inner limits in FIG. 18. The radiation traverses aperture 2001A before intercepting mirror 1201, and intercepts aperture 2002A after reflecting from mirror 1201.

Similar transmission and reflection apertures 2001B and 2002B are plotted in FIG. 20B for the system of FIGS. 13 and 17B. Surface height contours relative to object surface 103 are plotted at 6.75-nm intervals in aperture 2002B, showing the surface tilt of mirror 1202.

FIG. 20C shows transmission and reflection apertures 2001C and 2002C, similar to 2001A and 2002A in FIG. 20A, for the FIG. 17C system. (Again, note the difference in plot scale.)

FIG. 21 shows the theoretical radial intensity point-spread functions 2101, 2102 and 2103 at the image plane for the three respective designs of FIGS. 17A, 17B and 17C. Each curve represents the spot image intensity I as a function of displacement r from the geometric image point. The curves have the functional form defined by Eq. 21.1, and all three curves are scaled to the peak intensity $I_0$ at r=0. (In Eq. 21.1 $\lambda$ is the 13.5-nm operating wavelength, NA and NA_inner are defined in FIG. 18, and $J_1$ is a first-order Bessel function.) Eq. 21.1 is a small-NA approximation (cf. Eq. A24 in U.S. patent application Ser. No. 13/103,874 FIG. 40B), modified to include the annular obscuration, but it is approximately representative of high-NA performance.

For comparison, FIG. 21 also shows point-spread functions with no annular obscuration for NA values of 0.3 (2104) and 0.5 (2105). The obscuration creates significant side lobes in the intensity profile, which could significantly affect print resolution in the context of conventional mask-projection lithography. But in the context of the present invention the side lobes are less significant because the scanned-spot method eliminates coherent proximity effects in the printed image. A benefit of the obscuration is that it narrows the width of the point-spread function's central peak.

Illustrative Design Data (With Transmission Microlenses)

Any of the projection lens systems illustrated in FIGS. 17A-17C can be used with Schupmann transmission microlenses of the type illustrated in FIGS. 10 and 11. Exemplary data for the FIG. 17B system follows. All of the data in the "FIG. 17B" column of FIG. 18, with the exception of z_focus and z_fold, is applicable to this system, and the point-spread function for this system is represented by curve 2102 in FIG. 21.

Figure 22:
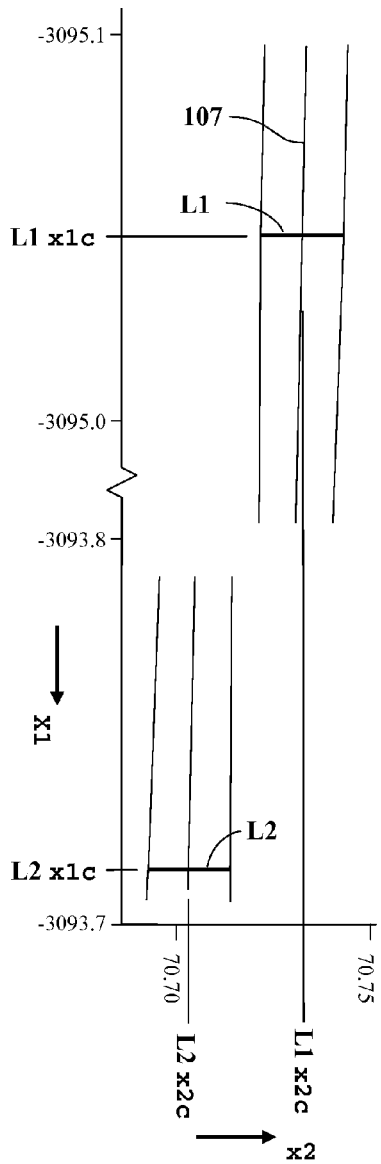
FIG. 22 shows a dimensioned, cross-sectional schematic of a Schupmann doublet design for a transmission microlens at the edge of the object field 103 in FIG. 17B.

FIG. 22 shows a dimensioned cross-sectional schematic of the Schupmann doublet design for a microlens at the edge of the object field 103 in FIG. 17B, where the projection system's aberrations are most severe. Phase-Fresnel lens elements 1001 and 1002 in FIGS. 10 and 11 are designated as L1 and L2, respectively, in FIG. 22. Microlens design data are tabulated in FIGS. 23A for L1 and 23B for L2. The $x_1$ offset d between the centers of elements L1 and L2 is 4/3 mm, as defined by Eq. 8.1 with a nominal lens radius R of 10 microns, $k=\frac{1}{2}$, and NA=0.03 (the object-space numerical aperture). The L1 and L2 substrate surface shapes are identical to the object surface shape as specified in FIG. 18 ("Obj." parameters), except that the $x1c$ parameters for L1 and L2 are incremented relative to the object surface by the "x1_offset" parameters in FIGS. 23A and 23B. (All lengths are in millimeter units.) Based on the construction in FIG. 8A, the offsets are defined by Eq's. 22.1 and 22.2 with $k=\frac{1}{2}$.

The L1 and L2 center points (indicated by coordinates $x1c, x2c,$ and $x3c$ in FIGS. 23A and 23B) are at the chief-ray intercept locations on the lens surfaces. The chief ray (107 in FIG. 22) intercepts the target image point at the edge of the image field and is parallel to the optical axis in the image space, i.e. the projection system is telecentric at the image. (The chief ray is only a construction ray; it does not represent a real ray because it is at the center of the obscuration zone. The M1 and M2 surface shapes defined by Eq. 18.1 can be used to ray-trace construction rays within the obscuration zone.)

EUV radiation is directed onto L1 by source collection optics, which are assumed to image an EUV source point onto an axial image point defined by the extension of the chief ray at L1 to the optical axis. (This point is at $x_1$=137.4 mm.) The chief ray is undeviated by either L1 or L2.

Each element L1 and L2 is characterized by its grating phase p as a function of position coordinates ($x_1, x_2, x_3$) on the grating substrate. The phase functions are optimized to neutralize both geometric aberration in the projection system and chromatic aberration in the lenses themselves. In a paraxial approximation the grating phase has the form of Eqs. 3.1, but for the FIG. 22 design example the grating phase is more accurately represented by a 12-th order polynomial function defined by Eq. 22.3. The non-zero coefficients $a_{j,k}$ are listed in FIGS. 23A and 23B. (The large number of polynomial coefficients does not imply exceedingly stringent tolerance requirements; it is rather indicative of the design's virtually perfect point-imaging capability. Length quantities in Eq. 22.3 are in millimeter units.) The coefficients are optimized by reverse-tracing rays from the target image point to the source image plane (at $x_1$=137.4 mm, as defined by the collection optics), and minimizing the mean-square ray intercept errors at the virtual source point for three wavelengths: 13.4 nm, 13.5 nm, and 13.6 nm.

Figure 24A:
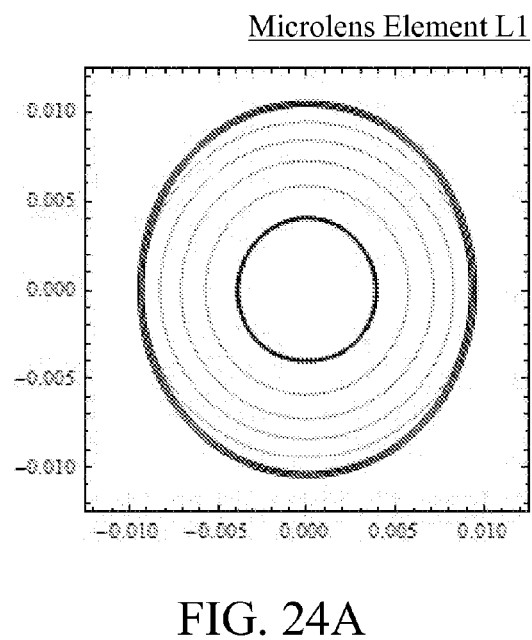
FIGS. 24A and 24B are plan views of the FIG. 22 microlenses, showing the phase-Fresnel grating phase contours and the annular clear aperture limits.

The L1 and L2 phase functions defined by Eq. 22.3 are illustrated as contour plots in FIGS. 24A (for L1) and 24B (for L2). The horizontal and vertical coordinates are $x_3$ and $x_2$ offsets, respectively, from the lens center (chief ray intercept) in millimeter units. Phase contours are plotted at 1-cycle intervals. Lens L1 is meniscus and the grating phase increases from edge to center. L2 is convex and its grating phase increases from center to edge.

Figure 24B:
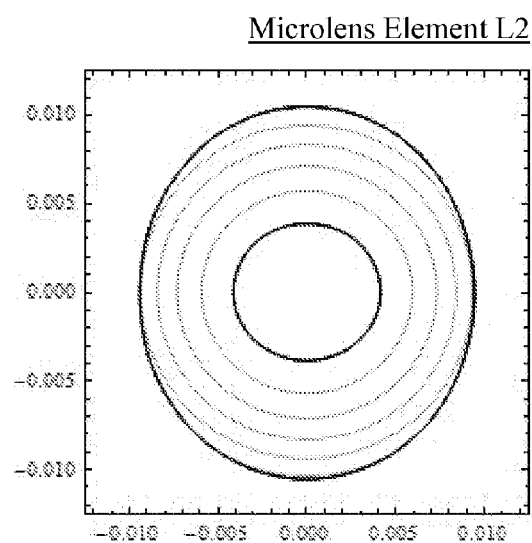

Either L1 or L2 may have an inner obscuration mask to block rays that do not intercept mirrors M1 and M2. FIGS. 24A and 24B illustrate the annular clear apertures for elements L1 and L2. The aperture limits are defined by back-tracing rays at the numerical aperture limits from the target image point to the lens surfaces. The L1 aperture trace exhibits some chromatic aberration from the diffractive ray trace through L2. The L1 design aperture is plotted at three wavelengths: 13.4 nm, 13.5 nm, and 13.6 nm. The L2 aperture plot is achromatic. (Putting the limiting aperture on L2 would make the numerical aperture limits wavelength-independent.)

The illustrated phase contours in FIGS. 24A and 24B (the ovals within the annular clear aperture) represent diffracting zones of a phase-Fresnel zone-plate lens (or an approximately equivalent blazed, multilevel structure). Each element has about five zones, with a minimum zone width of 900 nm based on paraxial approximations, Eq's. 3.1 and 3.2.

Throughput Estimate

Considering the FIG. 17B embodiment, the micromirror or microlens apertures can be assumed to have a center spacing of approximately 25 μm (cf. FIGS. 19B, 20B, 24A, and 24B), so the focused spots would have a 2.5 μm period on the image plane at 10× demagnification. The image field is 10 mm square (based on the image aperture radius ap3=5√2 mm, FIG. 18), so the total number of spots is ((10 mm)/(2.5 μm))$^2$= 1.6·10$^7$. Assuming that the spot exposures are centered on a 10-nm square grid, the total number of addressable grid points on a 300-mm wafer is $\pi$(150 mm)$^2$/(10 nm)$^2$=7.07·10$^{14}$. Thus the total number of exposure image frames required to fully cover a 300-mm wafer is (7.07·10$^{14}$)/ (1.6·10$^7$)=4.42·10$^7$. An EUV LPP source can operate at a repetition rate in excess of 500 kHz. (See Ref 3,p. 4.) At this rate the write time per wafer would be of order (4.42·10$^7$)/ (5·10$^5$ sec$^{-1}$)=88.4 sec. Taking into account overhead for wafer loading/unloading, field stepping and scan reversal, the throughput is of order 2 minutes per wafer, or 30 wafers per hour.

High-volume lithography systems typically achieve throughput performance in excess of 100 wafers per hour, but the comparatively low 30-wafer-per-hour throughput implies that the maskless system would require less source power. Alternatively, a single high-power source could supply radiation to multiple print units operating in parallel.

Source Collection Optics

Figure 25:
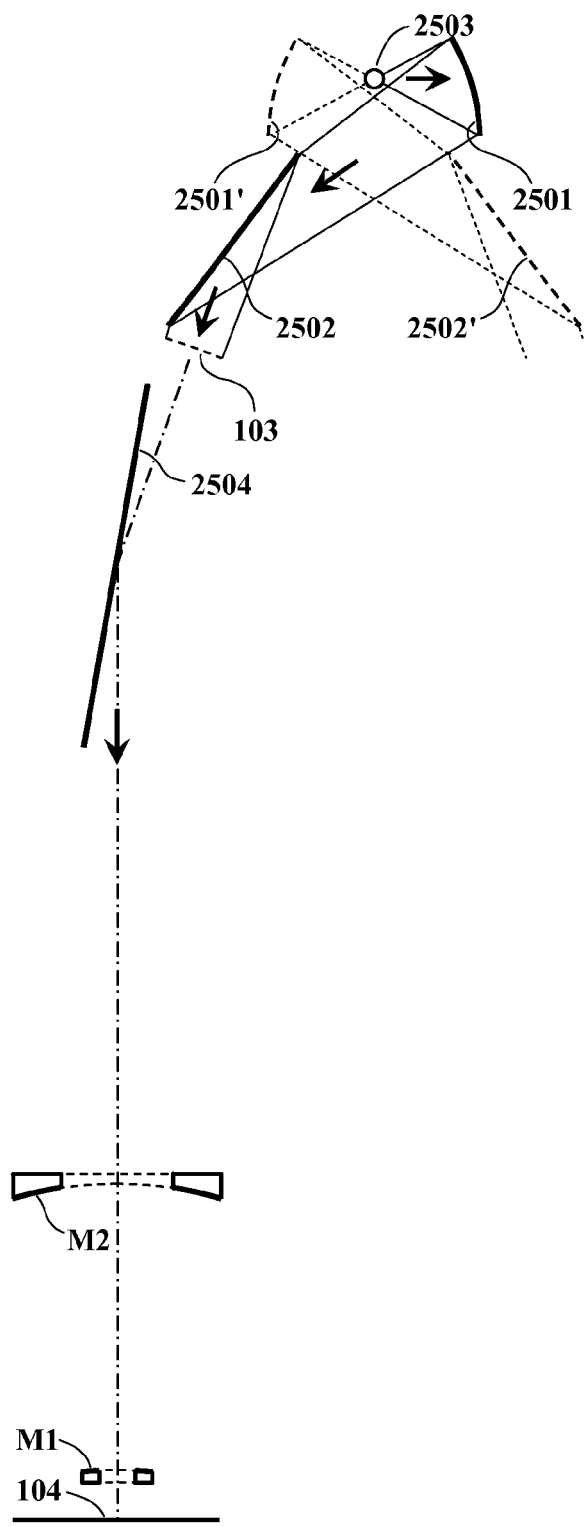
FIG. 25 illustrates EUV source collection optics comprising a near-normal-incidence multilayer mirror and a grazing-incidence mirror.

FIG. 25 illustrates an EUV source collection system comprising multilayer mirror 2501 and grazing-incidence mirror 2502, which convey radiation from a small source 2503 such as an LPP plasma to object surface 103. (Mirror 2502 may be slightly curved to optimize the target radiation profile at surface 103.) Multiple such collection systems could collect and distribute radiation from a single LPP source to multiple print units (e.g., as indicated schematically by collection mirrors 2501' and 2502'). Spot-generation optics (not shown in FIG. 22) are proximate surface 103, and the illustrated projection system (comprising mirrors M1 and M2 and image plane 104) resembles FIGS. 17A-17C. The projection optics include a flat, grazing-incidence folding mirror 2504, which directs the optical axis in a vertical direction.

The source collection optics would ideally be configured to achieve three conditions: (1) The radiation should be directed in the direction of the chief ray 107 at each spot 105 on surface 103 (cf. FIGS. 1A and 1B); (2) the geometric source demagnification at the image spots should be uniform across the image plane; and (3) the radiant intensity in the image spots should also be uniform across the image plane. However, deviations from ideality can be accommodated in the spot-generation optics. Specifically: (1) the micro-optics can incorporate some optical wedge to redirect incident radiation in the direction of the chief ray; (2) the microlens focal lengths can vary across the spot array to achieve uniform source demagnification across the array; and (3) the microlens transmittance values can be individually controlled (e.g. by the choice of optical film thicknesses) to achieve uniform radiant intensity across the image plane.

The sharing of LPP source power between print units has the advantage that less et endue is used by each unit, so the source size has less impact on print resolution. For example, if the FIG. 25 system collects a radiation cone of half angle 28° from a 100-µm diameter LPP source and distributes it over the object field (of radius $50\sqrt{2}$ mm, FIG. 18), then the collection system's focal length is 146 mm. The micromirrors 1201 in FIG. 12 have a focal length of 0.36 mm (i.e., twice z_fold), so the source demagnification at the object surface 103 is 146/0.36=406 and the demagnification at the image surface is 4060. A 100-µm diameter LPP source would thus be reduced to image-plane spots with geometric image diameters of (100 µm)/4060=25 nm, which is comparable to the diffraction limit ($\lambda$/NA=(13.5 nm)/0.3=45 nm). It should be noted, however, that the above-cited Ref 3 reports 550 kHz operation of a Sn LPP source with tin droplets as small as 17 µm in diameter. With a 17-µm source the geometric image of the source on the printing surface would only be about 4 nm wide under the preceding assumptions.

Projection Aperture Scaling

Figure 26:
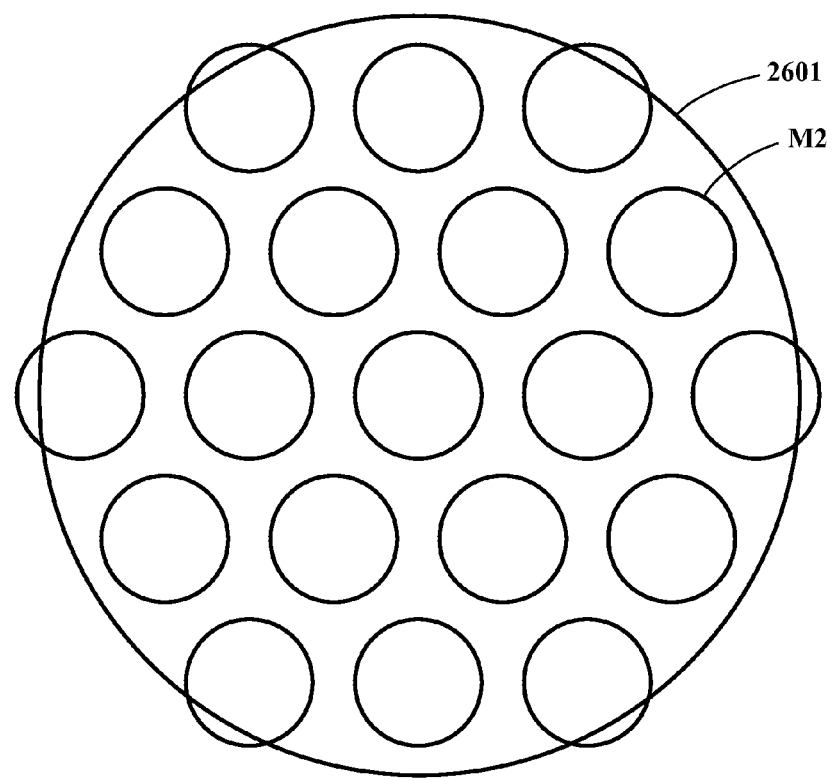
FIG. 26 illustrates an array of reduced-size (50-mm) projection subsystem apertures in plan view, in relation to a 300-mm wafer aperture.

In the illustrated embodiment the projection system is very large, e.g., one-half meter wide and 3 meters long in FIG. 17B, not including the source collection optics (FIG. 25). However, the system can be reduced to a more practical dimensional scale by partitioning the projection system between multiple apertures. For example, FIG. 26 illustrates an array of 19 M2 projection apertures in plan view, each with a diameter of 50 mm, disposed above a 300-mm wafer 2601. The projection system comprises 19 subsystems of the form illustrated in FIGS. 17A-17C, but with linear dimensions reduced by a factor of 5. The subsystems comprise separate spot-generation optics and projection optics, but otherwise may share elements in common (e.g., they may receive radiation from a common source and may operate with a common wafer-scanning mechanism). Scan patterns similar to those described in U.S. Pat. No. 7,116,405 could be employed to effect field stitching between subsystems.

Aperture partitioning has a number of advantages, including the following: The projection system is made more compact; smaller elements can be more easily manufactured; the printing surface flatness requirement is relaxed (due to the reduced image field size); management of thermal heat gain is less problematic; and geometric aberrations are reduced in proportion to the system size. (These advantages apply to DUV as well as EUV lithography.)

The microlens aperture dimensions (e.g. 25 µm for the FIGS. 17A and 17B configurations) could be maintained with a reduced-scale projection system. (With a fivefold linear scale reduction the number of microlenses per subsystem would be reduced by a factor of 25, from $1.6 \cdot 10^7$ to $6.4 \cdot 10^5$, but with 19 subsystems the total number of microlenses would be $1.2 \cdot 10^7$.) On the other hand, the reduced geometric aberrations could make it possible to also reduce the microlens scale, and thereby increase the total number of microlenses and system throughput. For example, the microlens diameters in the FIG. 17C configuration are approximately 320 µm (FIGS. 19C and 20C), but with a fivefold scale reduction of the projection system the microlens diameters could be reduced to 64 µm, maintaining the same number of microlenses per subsystem. With 19 subsystems, the total number of microlenses and system throughput would be increased by a factor of 19.

Manufacturing Processes

The projection mirrors M1 and M2 in FIGS. 1A and 1B are aspheric, but their shape tolerances are not extremely critical because the spot-generation optics can be configured to compensate for slightly misshaped mirrors. In the surface figuring process, the shape errors in the assembled surfaces can be tested by directing a point light source from the image plane back to the object surface, and analyzing the object conjugate point by means such as a Foucault knife-edge test, a Shack-Hartmann wavefront sensor, or a point diffraction interferometer. At this stage, any convenient wavelength may be used for testing, and the two surfaces' shape errors can be distinguished by performing the test at multiple image points.

After the surface figuring is completed, the projection mirror surfaces are coated with multilayer EUV-reflecting films, and the projection system's geometric aberrations are characterized at the operating EUV wavelength by again transmitting a point radiation source from the image plane back to the object surface. The test is performed at multiple image points to characterize the aberrations over the full field, and the results are used to determine the design prescription for the spot-generation micro-optics. (A similar characterization of the as-built source collection optics may also be used to finalize the micro-optics design.)

Molybdenum microlenses or micromirrors can be fabricated using a process such as gray-scale lithography or photo-assisted deposition or etching. In each of these processes, an optical radiation pattern is directed onto a photosensitive medium and is converted into a geometric surface profile pattern. The pattern may be formed directly in a molybdenum film, or it may be formed in a sacrificial film, followed by molybdenum deposition and planarization.

U.S. Pat. No. 6,133,986 outlines one technique that may be adapted for optical patterning of smoothly-contoured micro-optic structures. (See FIG. 17 in '986.) A variable radiation pattern is generated, e.g., by a spatial light modulator, and is optically imaged to infinity (or to a distant virtual image surface). The image radiation is collected by an array of microlenses, which focus the radiation onto an optically sensitive exposure surface. Each microlens focuses the radiation to a demagnified image of the source pattern on the surface. The projected radiation illuminates only a portion of the microlens array, but the array and exposure surface are together scanned (as illustrated by the direction arrows in '986 FIG. 17) to achieve full coverage of the surface. The radiation pattern is varied during the scan to optimize the pattern independently for different surface regions.

Multi-level grating structures can be fabricated by means similar to methods used for EUV phase-shift masks. For example, an eight-level EUV transmission grating could be formed by depositing eight bilayers, each consisting of approximately 20 nm of molybdenum on 2 nm of ruthenium, on an EUV-transmitting silicon substrate. The eight levels would then be defined by applying three mask and etch process, using the ruthenium films as an etch stop. (Each mask step doubles the number of surface levels.) Ruthenium has the advantage of having good EUV transmitting and phase-shift properties, as well as being a good etch-stop material (Ref 6). An eight-level blazed lens structure could alternatively be formed by performing three masked Mo depositions (e.g., using atomic layer deposition) with deposition layer thicknesses of 88.5 nm, 44.3 nm, and 22.1 nm.

For multi-level reflection gratings, a similar process could be used to pattern the mirror substrate before depositing the reflection coating. However, with 8 levels (i.e. 7 steps) the grating height is only 5.91 nm and the height tolerance range would be correspondingly smaller. The 8-level structure could be formed by applying three masked Mo depositions of thickness 3.38 nm, 1.69 nm, and 0.84 nm.

REFERENCES

The following additional patent and literature references are referred to in this disclosure and are incorporated by reference:

| U.S. Pat. No. 6,133,986 | October 2000 | Johnson |
| U.S. Pat. No. 6,133,710 | December 2001 | Wang et al. |
| U.S. Pat. No. 6,214,633 | April 2001 | Clark et al. |
| U.S. Pat. No. 6,498,685 | December 2002 | Johnson |
| U.S. Pat. No. 7,116,405 | October 2006 | Johnson |

Ref. 1: R. Kingslake, Lens Design Fundamentals (Academic Press, London, 1978). pp. 89-92.

Ref. 2: M. Bass, ed., Handbook of Optics, 2nd ed. (Optical Society of America, Washington, D.C., 1995), Vol. 2. (pp. 1.23-25 and 18.15)

Ref. 3: D. C. Brandt, I. V. Fomenkov, A. I. Ershov, W. N. Partlo, D. W. Myers, N. R. Bowering, A. N. Bykanov, G. O. Vaschenko, O. V. Khodykin, J. R. Hoffman, E. Vargas L., R. D. Simmons, J. A. Chavez, and C. P. Chrobak, "LPP EUV Source Development for HVM," in Proc. of SPIE Vol. 6517,Emerging Lithographic Technologies XI, M. J. Lercel, Ed., 65170Q (2007).

Ref. 4: F. Salmassi, E. M. Gullikson, E. H. Anderson, and P. P. Naulleau, "Multilayer phase-only diffraction gratings: Fabrication and application to extreme ultraviolet optics," J. Vac. Sci. Technol. B 25,pp. 2055-2058 (2007).

Ref. 5: M. Goldstein, R. Hudyma, P. Naulleau, and S. Wurm, "EUV micro-exposure tool at 0.5 NA for sub-16 nm lithography," Optics Letters, 33(4), pp. 2995-2997 (2008).

Ref. 6: H. Y. Jung, Y. R. Park, H. J. Lee, N.-E. Lee, C. Y. Jeong and J. Ahn, "Selective dry etching of attenuated phase-shift mask materials for extreme ultraviolet lithography using inductively coupled plasmas," J. Vac. Sci. Technol. B 27,pp. 2361-2365 (2009).

Ref. 7: C. Constancias, B. Dalzotto, P. Michallon, J. Wallace, and M. Saib, "Fabrication of large area ultrathin silicon membrane: Application for high efficiency extreme ultraviolet diffraction gratings," J. Vac. Sci. Technol. B 28,p. 194 (2010).

Ref. 8: Proceedings of the 2011 International Workshop on EUV and Soft X-Ray Sources, sponsored by EUV Litho, Inc., http://www.euvlitho.com/

Data from the following resource is also used in the disclosure:

Ref. 9: Center for X-Ray Optics (CXRO), Lawrence Berkeley Laboratory, online X-Ray Database, http://henke.lbl.gov/optical_constants/

CONCLUSION

The devices and methods disclosed herein have utility for maskless EUV lithography, and also for DUV or visible-light lithography and high-resolution printing. Additionally, the disclosed imaging mechanisms have obvious applicability for general-purpose imaging and microscopy.

While the above is a complete description of specific embodiments of the invention, the above description should not be taken as limiting the scope of the invention as defined by the claims.

What is claimed is:

1. A scanned-spot-array lithography system comprising a radiation source, source collection optics, spot-generation optics, projection optics, a scanning mechanism, and a modulation mechanism, which operate cooperatively to print a lithographic image on a photosensitive layer when the photosensitive layer is positioned proximate an image plane, wherein:

the source collection optics convey radiation from the radiation source to the spot-generation optics;

the spot-generation optics partition radiation into a plurality of radiation beams diverging from corresponding discrete object spots on an object surface;

the projection optics comprise two annular mirrors in a flat-image Schwarzschild configuration, which operate to image the object spots onto a periodic array of corresponding conjugate image spots on the image plane;

the spot-generation optics are configured to compensate for geometric point-imaging optical aberrations in the projection optics so that each image spot is a substantially diffraction-limited point; and the scanning mechanism raster-scans the photosensitive layer, and the modulation mechanism simultaneously modulates the beam intensities, to record a synthesized, high-resolution raster image on the photosensitive layer.

2. The scanned-spot-array lithography system of claim 1, wherein the radiation is extreme ultraviolet radiation.

3. The scanned-spot-array lithography system of claim 1, wherein the object surface is not flat.

4. The scanned-spot-array lithography system of claim 1, wherein the distribution of object spots on the object surface is non-periodic.

5. The scanned-spot-array lithography system of claim 1, wherein:

the spot-generation optics comprise transmitting microlenses; and each beam is formed by an achromatic microlens comprising a diffractive surface relief pattern formed on a refractive microlens.

6. The scanned-spot-array lithography system of claim 1, wherein the spot-generation optics comprise transmitting microlenses;

each beam is formed by a Schupmann-doublet microlens comprising first and second lens elements in series;

the first lens element focuses the radiation toward and through an intermediate focus between the first and second lens elements; and the second lens element receives divergent radiation from the intermediate focus and further diverges the radiation.

7. The scanned-spot-array lithography system of claim 6, wherein the lens elements are refracting elements.

8. The scanned-spot-array lithography system of claim 6, wherein the lens elements are diffractive elements.

9. The scanned-spot-array lithography system of claim 1, wherein the spot-generation optics comprise micromirrors;

each beam is formed by two micromirrors, a concave, annular focusing mirror with a central opening and a flat folding mirror;

the focusing mirror receives incident source radiation and it reflects and converges the radiation; and the folding mirror receives reflected radiation from the focusing mirror and reflects it through the opening in the focusing mirror and toward the projection optics.

10. The scanned-spot-array lithography system of claim 1, wherein
the spot-generation optics comprise micromirrors;
each beam is formed by four micromirrors including first and second diffractive mirrors and first and second flat folding mirrors;
the first diffractive mirror is an annular, focusing element with a central opening;
the second diffractive mirror is a diverging element;
the first diffractive mirror receives incident source radiation, and it reflects and converges the radiation;
the first folding mirror receives reflected radiation from the first diffractive mirror and reflects it through the opening in the first diffractive mirror;
the radiation reflected from the first folding mirror passes through and diverges from an intermediate focus, and then intercepts the second diffractive mirror, which reflects and further diverges the radiation;
the second folding mirror receives reflected radiation from the second diffractive mirror and reflects it toward the projection optics; and
the first and second diffractive mirrors are configured as a Schupmann achromatic doublet.

11. The scanned-spot-array lithography system of claim 9 or claim 10, wherein each beam is centered on a chief ray that is substantially orthogonal to the object surface.

12. The scanned-spot-array lithography system of claim 1, wherein the modulation mechanism individually modulates the beams.

13. The scanned-spot-array lithography system of claim 1, wherein:
the modulation mechanism does not modulate the beams individually; and
the beams are collectively modulated by a single optical modulator.

14. A scanned-spot-array system comprising multiple subsystems of claim 1 configured to operate in parallel and to simultaneously print onto a photosensitive layer on a common image plane, wherein the separate subsystems comprise separate spot-generation optics and projection optics.

15. The scanned-spot-array lithography system of claim 6, wherein the first and second lens elements of each Schupmann-doublet microlens are configured to achieve substantially achromatic point imaging at a corresponding image spot on the image plane.

16. The scanned-spot-array lithography system of claim 6, wherein the modulation mechanism comprises modulator elements at the intermediate foci.

17. The scanned-spot-array lithography system of claim 16, wherein each modulator element comprises a MEMS-actuated microshutter.

18. The scanned-spot-array lithography system of claim 16, wherein each modulator element comprises a Stacked-Grating Light Modulator.

19. An imaging system for use in a scanned-spot-array lithography system in which the imaging system, a radiation source, a scanning mechanism, and a modulation mechanism operate cooperatively to print a lithographic image on a photosensitive layer when the layer is positioned proximate an image plane, the imaging system comprising, in light path order:
(1) source collection optics that collect radiation from the radiation source and direct the radiation downstream;
(2) spot-generation optics that are
  (a) positioned to intercept radiation conveyed by the source collection optics, and
  (b) configured to partition the radiation into a plurality of radiation beams diverging from corresponding discrete object spots on an object surface; and
(3) projection optics that
  (a) are positioned to intercept radiation from the spot-generation optics,
  (b) comprise two annular mirrors in a flat-image Schwarzschild configuration, which operate to image the object spots onto a periodic array of corresponding conjugate image spots on the image plane, and
  (c) are characterized by geometric point-imaging optical aberrations;
wherein the spot-generation optics are further configured to compensate for the geometric point-imaging optical aberrations in the projection optics so that each image spot is a substantially diffraction-limited point.

20. An imaging system in a scanned-spot-array lithography system in which the imaging system converts light from a radiation source to a set of spots in an image plane, and a scanning mechanism and a modulation mechanism operate cooperatively to print a lithographic image on a photosensitive layer when the photosensitive layer is positioned proximate the image plane, the imaging system comprising:
source collection optics that collect and convey radiation from the radiation source;
spot-generation optics positioned to intercept radiation conveyed by the source collection optics, the spot-generation optics being configured to partition the radiation into a plurality of radiation beams diverging from corresponding discrete object spots on an object surface; and
projection optics positioned to intercept radiation from the spot-generation optics and to image the object spots onto a periodic array of corresponding conjugate image spots on the image plane, the projection optics comprising two annular mirrors in a flat-image Schwarzschild configuration;
wherein the projection optics are characterized by geometric point-imaging optical aberrations and the spot-generation optics are further configured to compensate for the geometric the point-imaging optical aberrations in the projection optics so that each image spot is a substantially diffraction-limited point.

* * * * *

UNITED STATES PATENT AND TRADEMARK OFFICE
CERTIFICATE OF CORRECTION

PATENT NO. : 9,097,983 B2
APPLICATION NO. : 13/801919
DATED : August 4, 2015
INVENTOR(S) : Kenneth C. Johnson It is certified that error appears in the above-identified patent and that said Letters Patent is hereby corrected as shown below:

In the Specification

Column 6, Line 12,
Delete "$c_i$ is a strong function of wavelength $\lambda$ due to the high" and insert
-- $c_t$ is a strong function of wavelength $\lambda$ due to the high --

Column 9, Line 44,
Delete "subscripts indicating that they are evaluated at $\lambda_D$. ($c_{td}$ is equal" and insert
-- subscripts indicating that they are evaluated at $\lambda_D$. ($c_{tD}$ is equal --

Column 11, Line 22,
Delete "exponent (Eq. 8.6). For example," and insert
-- exponent (Eq. 8.6). For example, if --

Column 15, Line 51,
Delete "ture-$c_i$, spherical-wave incident beam into a curvature-$c_i$ $c_r$" and insert
-- ture-$c_i$, spherical-wave incident beam into a curvature-$c_r$ --

Column 15, Line 65,
Delete "decomposed into a Fourier series with coefficients $\Sigma_m$ (Eq." and insert
-- decomposed into a Fourier series with coefficients $\rho_m$ (Eq. --

Column 16, Line 1,
Delete "$c_{tD} = C_{rD}$ can be applied to adapt the equations for transmis-" and insert
-- $c_{tD} = c_{rD}$ can be applied to adapt the equations for transmis- --

Column 16, Line 32,
Delete "The and x2 coordinate scales are marked in millimeters. The" and insert
-- The x1 and x2 coordinate scales are marked in millimeters. The --

Signed and Sealed this
Seventeenth Day of May, 2016

Michelle K. Lee
*Director of the United States Patent and Trademark Office*

CERTIFICATE OF CORRECTION (continued)
U.S. Pat. No. 9,097,983 B2

In the Specification

Column 17, Line 1,
Delete "The M2 aperture radius (apt) is fixed at 250 mm for all three" and insert
-- The M2 aperture radius (ap2) is fixed at 250 mm for all three --

Column 17, Line 8,
Delete "coincides with the optical axis, and is zero at the image plane" and insert
-- coincides with the optical axis, and x1 is zero at the image plane --

Column 17, Line 41,
Delete "induced phase shifts in multiples of $27\pi$ radians at a 13.5-nm" and insert
-- induced phase shifts in multiples of $2\pi$ radians at a 13.5-nm --